(12) United States Patent
Ogawa et al.

(10) Patent No.: US 8,385,847 B2
(45) Date of Patent: *Feb. 26, 2013

(54) SWITCHING ELEMENT, ANTENNA SWITCH CIRCUIT AND RADIO FREQUENCY MODULE USING THE SAME

(75) Inventors: Takashi Ogawa, Tokyo (JP); Shinichiro Takatani, Koganei (JP); Shigeki Koya, Kokubunji (JP); Hiroyuki Takazawa, Hino (JP); Shinya Osakabe, Maebashi (JP); Akishige Nakajima, Higashiyamato (JP); Yasushi Shigeno, Maebashi (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/929,940

(22) Filed: Feb. 25, 2011

(65) Prior Publication Data

US 2011/0156983 A1 Jun. 30, 2011

Related U.S. Application Data

(63) Continuation of application No. 12/805,409, filed on Jul. 29, 2010, now Pat. No. 7,899,412, which is a continuation of application No. 12/314,644, filed on Dec. 15, 2008, now Pat. No. 7,783,265, which is a continuation of application No. 11/291,815, filed on Dec. 2, 2005, now abandoned.

(30) Foreign Application Priority Data

Dec. 7, 2004 (JP) .................................. 2004-353715

(51) Int. Cl.
*H04B 1/44* (2006.01)
(52) U.S. Cl. ............. 455/83; 455/82; 455/13.3; 455/78; 343/876

(58) Field of Classification Search .................... 455/83, 455/82, 13.3, 78, 19, 562.1, 575.7; 343/876; 257/192, 72, 59
See application file for complete search history.

(56) References Cited

U.S. PATENT DOCUMENTS

| 4,810,911 A | * | 3/1989 | Noguchi | ........................ 327/431 |
| 4,989,058 A | * | 1/1991 | Colak et al. | ................... 257/493 |
| 5,004,918 A | | 4/1991 | Tsuno et al. | |

(Continued)

FOREIGN PATENT DOCUMENTS

JP 2000-101032 4/2000

OTHER PUBLICATIONS

Leuthner et al., ("STEM-Holography Using the Electron Biprism", Phys. Stat. Sol. (a) 116, 113, 1989).

(Continued)

*Primary Examiner* — Minh D Dao
(74) *Attorney, Agent, or Firm* — Stites & Harbison, PLLC; Juan Carlos A. Marquez, Esq.; Stephen J. Weyer, Esq.

(57) ABSTRACT

A switching element is provided that realizes an stabilize a potential between the gates of the multi-gates without an increase in the insertion loss, and an antenna switch circuit and a radio frequency module each using the switch element. The switching element includes two ohmic electrodes 39, 40 formed on a semiconductor substrate, at least two gate electrodes 41, 42 disposed between the two ohmic electrodes, and a conductive region 45 disposed between the adjacent gate electrodes among the at least two gate electrodes, a field effective transistor being structured by the two ohmic electrodes, the at least two gate electrodes, and the conductive region. The conductive region has a wider portion that is wider in width than the conductive region interposed between the adjacent gate electrodes on one end thereof. The distance between the adjacent gate electrodes is narrower than the width of the wider portion. Resistors 44, 46 are connected in series between the two ohmic electrodes through the wider portion.

20 Claims, 17 Drawing Sheets

U.S. PATENT DOCUMENTS

| | | | | |
|---|---|---|---|---|
| 5,208,564 A * | 5/1993 | Burns et al. | | 333/164 |
| 5,828,119 A * | 10/1998 | Katsube | | 257/491 |
| 5,955,764 A * | 9/1999 | Katsube | | 257/355 |
| 6,087,679 A * | 7/2000 | Yamazaki et al. | | 257/65 |
| 6,107,639 A * | 8/2000 | Yamazaki et al. | | 257/49 |
| 6,163,321 A | 12/2000 | Kiyokawa | | |
| 6,218,890 B1 | 4/2001 | Yamaguchi et al. | | |
| 6,376,886 B2 * | 4/2002 | Mizuhara | | 257/386 |
| 6,392,258 B1 * | 5/2002 | Hirata et al. | | 257/197 |
| 6,445,005 B1 * | 9/2002 | Yamazaki et al. | | 257/72 |
| 6,489,628 B1 * | 12/2002 | Morizuka | | 257/12 |
| 6,515,299 B1 * | 2/2003 | Yamazaki et al. | | 257/49 |
| 6,528,378 B2 | 3/2003 | Hirata et al. | | 438/317 |
| 6,548,838 B1 * | 4/2003 | Anda et al. | | 257/192 |
| 6,590,230 B1 * | 7/2003 | Yamazaki et al. | | 257/72 |
| 6,654,604 B2 * | 11/2003 | Yokogawa et al. | | 455/424 |
| 6,693,044 B1 * | 2/2004 | Yamazaki et al. | | 438/745 |
| 6,759,656 B2 | 7/2004 | Tomita | | |
| 6,822,262 B2 * | 11/2004 | Yamazaki et al. | | 257/59 |
| 6,894,312 B2 * | 5/2005 | Yamazaki et al. | | 257/72 |
| 6,903,383 B2 * | 6/2005 | Yokogawa et al. | | 257/192 |
| 7,064,359 B2 * | 6/2006 | Ishida et al. | | 257/192 |
| 7,161,197 B2 * | 1/2007 | Nakatsuka et al. | | 257/270 |
| 7,307,298 B2 * | 12/2007 | Yamane et al. | | 257/280 |
| 7,312,482 B2 * | 12/2007 | Nakajima et al. | | 257/159 |
| 7,783,265 B2 * | 8/2010 | Ogawa et al. | | 455/83 |
| 7,899,412 B2 * | 3/2011 | Ogawa et al. | | 455/83 |
| 2006/0118951 A1 * | 6/2006 | Ogawa et al. | | 257/728 |
| 2009/0267076 A1 * | 10/2009 | Yamazaki et al. | | 257/72 |

OTHER PUBLICATIONS

Tanji, T., Ru Q., Tonomura, A., "Differential Microscopy by Conventional Electron Off-Axis Holography", Appl. Phys. Lett. 69, 18, 1996.

* cited by examiner

SWITCHING ELEMENT, ANTENNA SWITCH CIRCUIT AND RADIO FREQUENCY MODULE USING THE SAME

CROSS REFERENCE TO RELATED APPLICATIONS

This application is a Continuation of U.S. patent application Ser. No. 12/805,409 filed Jul. 29, 2010, now U.S. Pat. No. 7,899,412, which is a Continuation of U.S. patent application Ser. No. 12/314,644 filed Dec. 15, 2008, now U.S. Pat. No. 7,783,265, which is a Continuation of U.S. patent application Ser. No. 11/291,815 filed Dec. 2, 2005 now abandoned. Priority is claimed based on U.S. patent application Ser. No. 12/805,409 filed Jul. 29, 2010, which claims priority from U.S. patent application Ser. No. 12/314,644 filed Dec. 15, 2008, which claims priority from U.S. application Ser. No. 11/291,815 filed Dec. 2, 2005, which claims priority from Japanese Patent Application No. 2004-353715 filed Dec. 7, 2004, all of which are incorporated by reference.

FIELD OF THE INVENTION

The present invention relates to a switching element using a field effect transistor whose conduction and nonconduction are controlled, and more particularly to a switching element suitable for interrupting a signal large in electric power as well as an antenna switch circuit and a radio frequency module which use the switching element.

BACKGROUND OF THE INVENTION

In a radio communication apparatus such as a mobile terminal, one antenna is shared with transmission and reception, and a connection to the antenna is frequently switched over between the transmission and the reception by an antenna switch. Also, in the case where the mobile terminal is adaptive to plural communication systems, the antenna switch is so structured as to switch over the connections of the antenna between plural transmitting circuits and plural receiving circuits. It is general that a transmitted signal that is outputted from the transmitting circuits is large in electric power so as to exceed 1 W in a cellular phone. The antenna switch is set with such a performance that the transmitted signal large in the electric power is high in quality, and does not include an interfering wave that adversely affects the communication of another frequency band. Accordingly, in the case of using the switching element using a transistor as the antenna switch, the switching element is so designed as to be high in withstand voltage and suppress a harmonic distortion to a lower value.

In the case of using a field effect transistor for the switching element, there are generally conducted an improvement in the withstand power property by using a multi-gate transistor in which plural gates are disposed between two ohmic electrodes (a drain electrode and a source electrode), and a more improvement in the withstand power property by connecting the multi-gate transistors in multi-stages. Patent document 1: Japanese Patent Laid-open No. 2000-101032 discloses an example of a structure in which $n^+$ electrodes that are formed between gate electrodes as inter-gate regions are connected to ohmic electrodes through resistors higher in resistance value than the $n^+$ electrodes in the multi-gate transistor. An example of a structure having four gate electrodes is shown in FIG. 16. The gate electrodes 18 to 20 and the $n^+$ electrodes 22 to 24 are disposed between the ohmic electrodes 16 and 17, and the $n^+$ electrodes 22 to 24 are connected to the ohmic electrodes 16 and 17 through potential stabilization resistors 25 to 28.

SUMMARY OF THE INVENTION

FIG. 17 shows a general positive power driving SPDT (single pole double throw) switching circuit. The switching circuit has one common terminal 4 and two input/output terminals 2, 3. In the case of using the switch circuit as an antenna switch circuit that switches over between the transmitting circuit and the receiving circuit, there are used the terminal 2 as a transmitting terminal, the terminal 3 as a receiving terminal, and the terminal 4 as an antenna terminal. Switching elements 5 and 6 each having a field effect transistor are disposed between the terminal 2 and the terminal 4 and between the terminal 3 and the terminal 4, respectively. Terminals 14 and 15 are control terminals of the switching elements 5 and 6. Capacitors 7, 8 and 9 are high frequency coupling capacitors, and resistors 10 and 11 are isolation resistors for preventing the transmitted and received signals from leaking to the terminals 14 and 15. The resistors 12 and 13 are bias resistors for equally supplying control signals that are inputted from the terminals 14 and 15 to the switch.

A large electric power that exceeds 1 W at the maximum is inputted to the transmitting terminal 2 from the transmitting circuit. For that reason, there is applied a structure in which two stages of dual gate transistors each having two gates are connected to the respective switching elements 5 and 6 tandem.

At the time of transmission, 0 V is applied to the terminal 15, and a positive voltage is applied to the terminal 14. In this situation, the switching element 5 is rendered conductive because a forward voltage is applied between the terminal 14 and a point "a", and the switching element 6 is rendered nonconductive because a backward voltage is applied between the point "a" and the terminal 15. As a result, the transmitted signal that has been inputted to the terminal 2 is outputted to the antenna terminal 4 through the switching element 5. In the switching element 5, a potential difference between the ohmic electrode and the gate electrode which are connected with the bias resistor 12, but a potential between the gate electrode and the gate electrode is unstable. When the latter potential is unstable, the withstand power property is deteriorated, and the harmonic distortion is liable to increase. At the time of reception, 0 V is applied to the terminal 14, and a positive voltage is applied to the terminal 15 with the result that the switching element 5 is made nonconductive, and the switching element 6 is made conductive. As a result, the received signal that is inputted from the antenna terminal 4 is outputted to the terminal 3 through the switching element 6. Because the received signal is a faint signal, the harmonic distortion leads to no problem.

As described above, Japanese Patent Laid-open No. 2000-101032 discloses the switching element in which the $n^+$ electrodes 22 to 24 which are the inter-gate regions are connected to the ohmic electrodes 16 and 17 through the potential stabilization resistors 25 to 28. However, the switching element suffers from the following problems.

First, as being understood from FIG. 16, the widths of the $n^+$ electrodes 22 to 24 are larger than those of the resistors 25 to 28. Since the width of the resistor is generally set to about 3 μm in the width in a standard semiconductor process, the widths of the $n^+$ electrodes 22, 23, and 24 are set to 3 μm or larger. This means that the ON resistance is increased, and the insertion loss is increased because the inter-gate distance cannot be reduced. Also, because the potential stabilization resistors 25 to 28 are disposed between the gate electrode and the ohmic electrode, or between the gate electrodes, a distance between the gate electrodes must be increased. This leads to the fact that the ON resistance is increased and the insertion loss is increased. In the present specification, the widths of the gate electrodes are directed to the size in the longitudinal direction of the drawing, and the lengths of the gate electrodes are directed to the size in the lateral direction of the drawing according to the general rule. The widths of the ohmic electrodes and the $n^+$ electrodes are directed to the size in the lateral direction of the drawing, and the lengths thereof are directed to the size in the longitudinal direction of the drawing.

The patent document 1 discloses a structure in which three switching elements one of which is shown in FIG. 16 are connected in parallel as a method of increasing the gate width in order to increase a permissible power of the switching element. In this case, since the potential stabilization resistor is disposed in each of the switching elements, the number of potential stabilization resistors increases, thereby making it impossible to downsize the parallel connection structure. In addition, as shown in FIG. 18, wirings 201a and 201b are formed for connecting an electrode 16a and an electrode 16b of the same ohmic electrode, and an electrode 17a and an electrode 17b of the same ohmic electrode mutually, respectively. The wirings 201a and 201b must cross lead lines 200a to 200d and lead lines 200e to 200h of the gate electrodes. As a result, cross portions 202a to 202h each having an inter-electrode capacity are formed. That is, the capacities between the respective gate electrodes and the respective ohmic electrodes are increased. Those capacities lead to the insertion loss and the isolation deterioration when the switching element is nonconductive.

The present invention has been made in view of the above is to provide a switching element that can stabilize the potential between the gates of the multi-gates without an increase in the insertion loss, an antenna switch circuit using the switching element, and a radio frequency module using the switching element.

In order to achieve the above object, according to the present invention, there is provided a switching element comprising: two ohmic electrodes formed on a semiconductor substrate; at least two gate electrodes that are disposed between the two ohmic electrodes; and an conductive region that is interposed between the adjacent gate electrodes of the at least two gate electrodes so as to constitute a field effect transistor, wherein the conductive region has a wider portion that is wider than the conduction region interposed between the adjacent gate electrodes at one end thereof, a distance between the adjacent gate electrodes is narrower than the width of the wider portion, and a resistor is connected in series between the two ohmic electrodes through the wider portion. The distance between the gate electrodes can be set without being affected by the size of the wider portion for connecting the resistor, that is, a connecting portion. Accordingly, it is expected to provide a low-loss switching element that can reduce the distance between the gate electrodes without an increase in an insertion loss, and can stabilize the potential between the gates of the multi-gates.

In order to achieve the above object, according to the present invention, there is provided an antenna switch circuit comprising: a first terminal for inputting a transmitted signal; a second terminal that is connected to an antenna; a third terminal for outputting a received signal that is received by the antenna; a first switching element that is structured as above and connected between the first terminal and the second terminal; and a second switching element that is structured as above and connected between the second terminal and the third terminal, wherein the first switching element is rendered conductive and the second switching element is rendered nonconductive at the time of transmission, and the first switching element is rendered nonconductive and the second switching element is rendered conductive at the time of reception. It is expected to realize the antenna switch circuit that can interrupt the transmitted signal large in electric power and obtains a high isolation between the transmission and the reception because there are used the low-loss switching elements that can stabilize the potential between the gates of the multi-gates. Accordingly, it is expected to realize the antenna switch circuit that is suitable for a case in which the connection between plural communication circuits and a common antenna to those communication circuits is switched over.

In order to achieve the above object, according to the present invention, there is provided a radio frequency module, comprising: a first amplifier that amplifies a transmitted signal; a second amplifier that amplifies a received signal that is received by an antenna; and an antenna switch circuit that is structured as above, transmits the transmitted signal outputted by the first amplifier to the antenna at the time of transmission, and transmits the received signal received by the antenna to the second amplifier at the time of reception. It is expected to realize a radio frequency module suitable for being mounted on a radio communication device such as a cellular phone adaptive to plural communication systems since there is used the antenna switch circuit which can interrupt the transmitted signal large in electric power and obtain a high isolation between the transmission and the reception, and suitable for a case in which the connection between plural communication circuits and a common antenna to those communication circuits is switched over.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Hereinafter, a description will be given in more detail of a switching element, and an antenna switch circuit and a radio frequency module using the switching element according to several embodiments of the present invention with reference to the accompanying drawings.

Figure 1A:
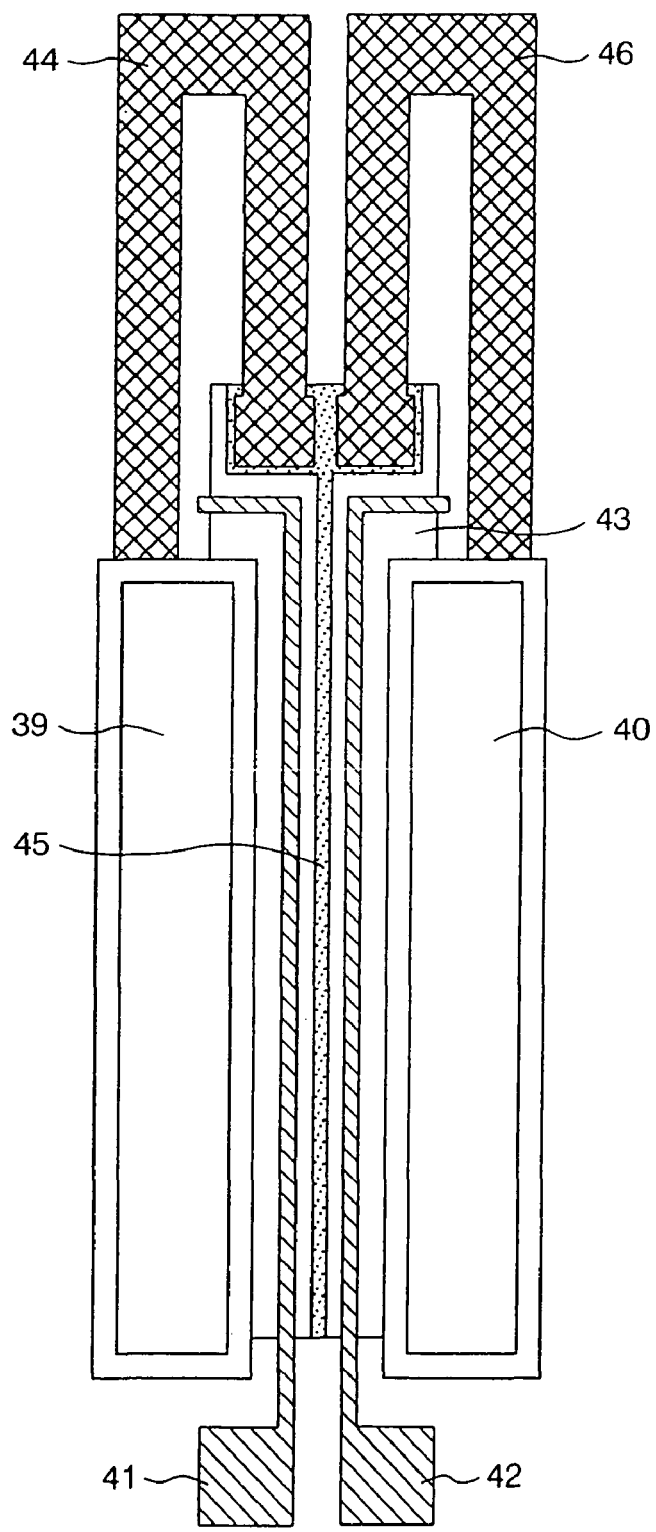
FIG. 1A is a plan view for explaining a switching element according to a first embodiment of the present invention.
Figure 1B:
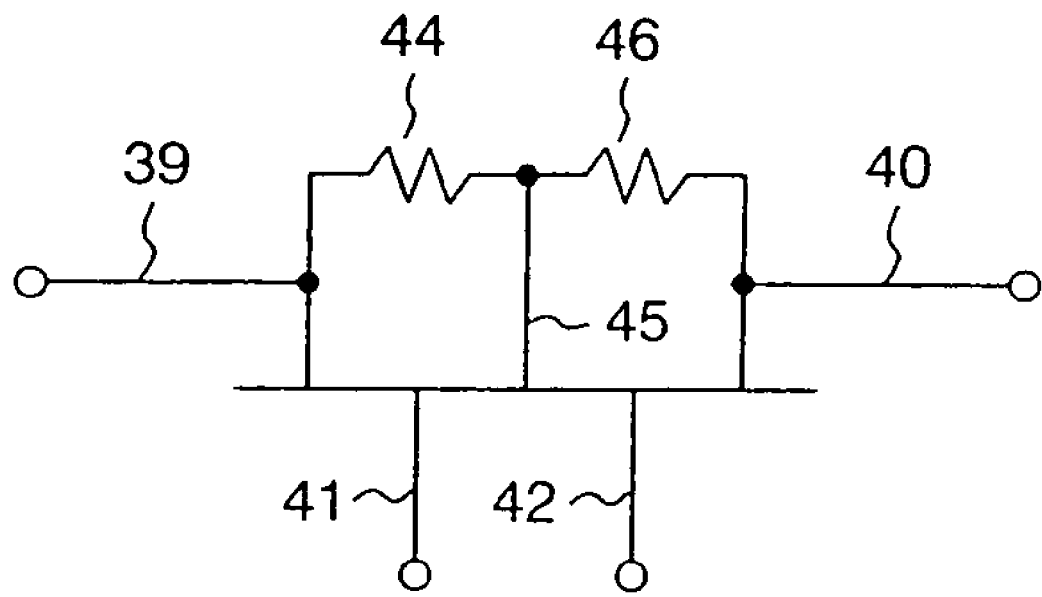
FIG. 1B is a circuit diagram for explaining the switching element according to the first embodiment of the present invention.

FIGS. 1A and 1B show a first embodiment of the present invention. This embodiment is related to a dual gate switching element that is formed by a high electron mobility transistor (hereinafter referred to as "HEMT") which is a field effect transistor. This switching element is used as a primary element in an antenna switch circuit having a radio frequency module which is mounted on a mobile communication device such as a cellular phone.

In a layout shown in FIG. 1A, gate electrodes 41 and 42 which are 0.5 μm in the length and 1.5 μm in the distance between the gate electrodes are formed between two ohmic electrodes 39 and 40 which are 5 μm in the width. Distances between the ohmic electrode 39 and the gate electrode 41 and between the ohmic electrode 40 and the gate electrode 42 are 1.0 μm, respectively. One ends of the gate electrodes 41 and 42 are thickened to about 3 to 5 μm in the length because wirings and bias supply resistors are connected to those gate electrodes 41 and 42. The other ends of the gate electrodes 41 and 42 extend in different directions outside of the ohmic electrodes. An element separation region 43 is so formed as to include those portions.

An n+ electrode 45 formed of an n+ layer that is 0.5 μM in the width is disposed between the gate electrodes 41 and 42 in a region that is interposed between the ohmic electrodes 39 and 40. The n+ electrode 45 of a portion surrounded by the element separation region 43 and the gate electrodes 41, 42 outside of the ohmic electrodes 39 and 40 are widened. One ends of potential stabilization resistors 44 and 46 are connected to the wider portion, the other end of the potential stabilization resistor 44 is connected to the ohmic electrode 39, and the other end of the potential stabilization resistor 46 is connected to the ohmic electrode 40. The potential stabilization resistors 44 and 46 are connected to the n+ electrode 45 to feed electricity to the n+ electrode 45, and the wider portion of the n+ electrode 45 forms a feeding point.

The above layout makes it possible to resistively connect the n+ electrode and the ohmic electrodes while minimizing the inter-gate distance without being affected by the arrangement of the potential stabilization resistors 44 and 46.

Thin film resistant layers are employed for the potential stabilization resistors 44 and 46. The thin film resistant layers are connected to the wider portion of the n+ electrode 45 by other wiring layers which are not shown in the figure. The potential stabilization resistors 44 and 46 are not limited by the thin resistant layer but can be formed of the same semiconductor layer as the n+ electrode 45 or a partial semiconductor layer of the n+ electrode 45. In this case, the semiconductor layers that form the potential stabilization resistors 44 and 46 are continuously connected from the wider portion of the n+ electrode 45. FIG. 1B shows a circuit diagram of the switching element according to this embodiment in which the n+ electrode 45 is connected to the potential stabilization resistors 44 and 46 as described above.

Figure 2:
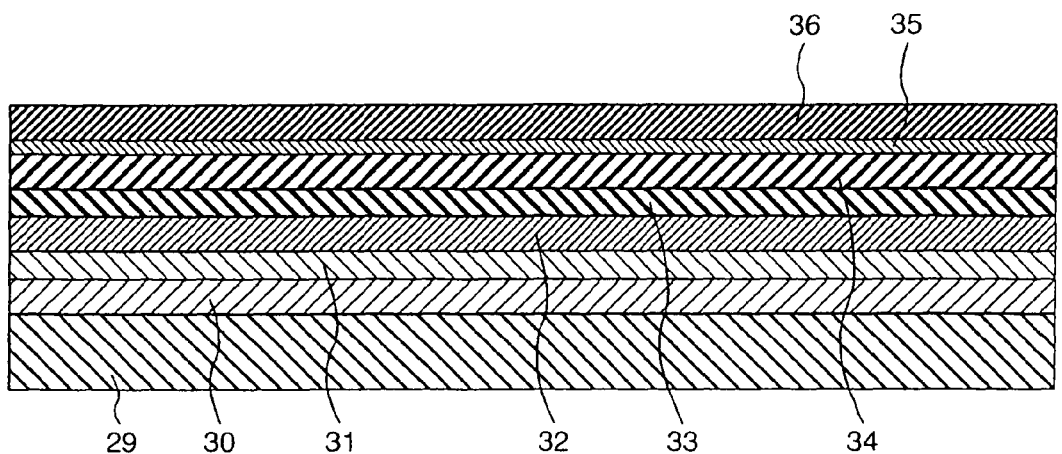
FIG. 2 is a first sectional view for explaining a manufacturing process according to the first embodiment.

Hereinafter, a process of manufacturing the switching element according to this embodiment will be described. First, as shown in FIG. 2, a buffer layer 30, an electron supply layer 31, a channel layer 32, an electron supply layer 33, a Schottky layer (electron supply layer) 34, an interlayer film 35, and an n+ layer (n-type cap layer) 36 are sequentially epitaxially grown on a semiconductor substrate (hereinafter referred to simply as "substrate") 29 made of GaAs which is a compound semiconductor, for example, through a metal organic chemical vapor deposition (MOCVD).

The buffer layer 30 is formed by sequentially stacking a non-doped GaAs layer that is about 1000 Å in the thickness, a non-doped AlGaAs (aluminum gallium arsenide) layer that is about 100 Å in the thickness, a non-doped GaAs layer that is about 500 Å in the thickness, and a non-doped AlGaAs layer that is about 3000 Å in the thickness from the lower layer.

The electron supply layer 31 is formed of an n+ type AlGaAs layer that is about 100 Å in the thickness, and impurity ions (for example, silicon ions) having an n-type conductivity type (first conductivity type) is introduced into the electron supply layer 31 with the density of about $5 \times 10^{17}$ cm$^{-3}$.

The channel layer 32 is formed by sequentially stacking a non-doped AlGaAs layer that is about 30 Å in the thickness, a non-doped GaAs layer that is about 40 Å in the thickness, a non-doped InGaAs layer that is about 80 Å in the thickness, a non-doped GaAs layer that is about 40 Å in the thickness, and a non-doped AlGaAs layer that is about 30 Å in the thickness, from the lower layer.

The electron supply layer 33 is formed by an n+ type AlGaAs layer that is about 100 Å in the thickness, and impurity ions (for example, silicon ions) having an n-type conductivity type are introduced into the electron supply layer 33 with the density of about $3 \times 10^{18}$ cm$^{-3}$.

The Schottky layer 34 is formed by an n+ type AlGaAs layer that is about 590 Å in the thickness, and impurity ions (for example, silicon ions) having an n-type conductivity type are introduced into the Schottky layer 34 with the density of about $2\times10^{16}$ cm$^{-3}$.

The interlayer film 35 is formed by an n$^+$ type AlGaAs layer that is about 30 Å in the thickness, and impurity ions (for example, silicon ions) having an n-type conductivity type are introduced into the interlayer film 35 with the density of about $5\times10^{18}$ cm$^{-3}$.

The n$^+$ film 36 is formed by an n$^+$ type GaAs layer that is about 1400 Å in the thickness, and impurity ions (for example, silicon ions) having an n-type conductivity type are introduced into the n$^+$ film 36 with the density of about $5\times10^{18}$ cm$^{-3}$.

The above epitaxial crystal structure is of a distortion channel HEMT (hereinafter referred to as "pHEMT: pseudomorphic HEMT"). After the above epitatial growth has been conducted, element separation is conducted through a mesa etching method to form an $^\circ$ ohmic electrode 37 that comes in ohmic contact with the n$^+$ layer 36 at a given position. The ohmic electrode 37 serves as a source electrode and a drain electrode of the field effect transistor.

Figure 4:
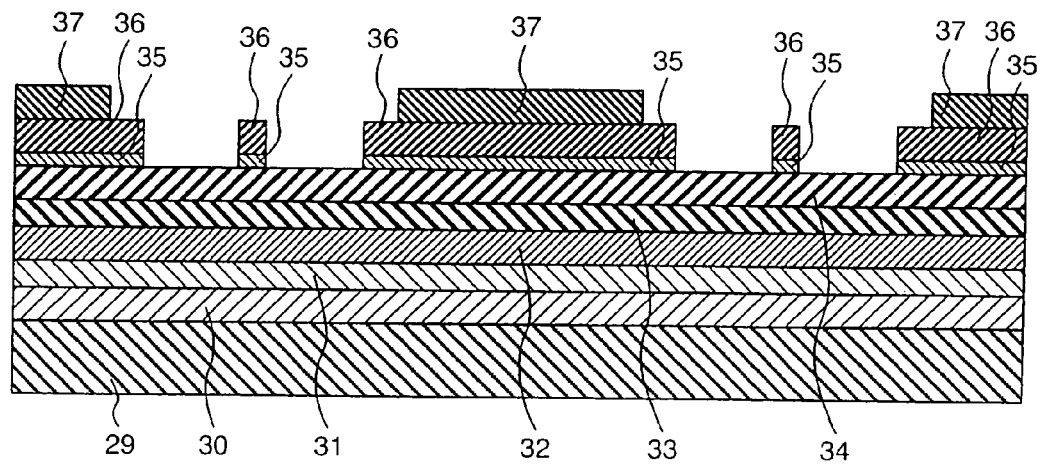
FIG. 4 is a third sectional view for explaining the manufacturing process according to the first embodiment.
Figure 5:
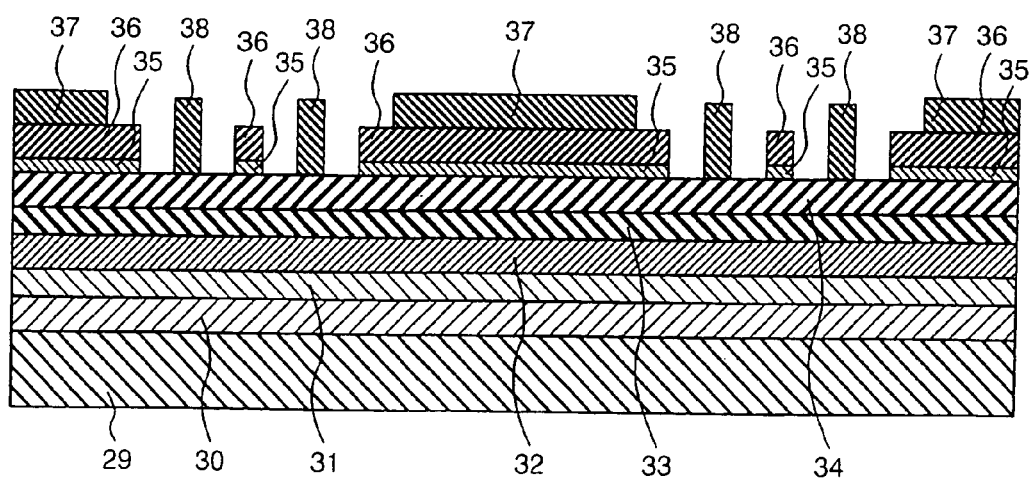
FIG. 5 is a fourth sectional view for explaining the manufacturing process according to the first embodiment.

Subsequently, the n$^+$ layer 36 and the interlayer film 35 at portions where the gate electrodes are formed are removed (FIG. 4). Then, a gate electrode 38 is formed (FIG. 5). The gate electrode 38 is set to 1.0 μm or lower in the gate length, and more preferably to about 0.5 μm. Also, the gate electrode 38 is formed of a metal layer with Pt (platinum) as the lowest layer, and for example, a metal layer resulting from sequentially stacking Pt, Ti (titanium), Pt, and Au (gold) from the lower layer. The thickness of Pt that is the lowest layer is about 150 Å. The Pt layer reacts with the Schottky layer 34 in the following heating process, and is embedded by about 380 Å into an embedded gate. Alternatively, a gate electrode that is not embedded may be used, and in this case, the gate electrode 38 is formed of a metal layer resulting from sequentially stacking Ti, Pt, and Au from the lower layer. Also, in this case, the thickness of the Schottky layer 34 is thinned to about 200 Å.

FIG. 5 shows a sectional structure of a dual gate element having two gate electrodes 38 between the ohmic electrodes 37. An n$^+$ layer (n-type cap layer) 36 that forms an n$^+$ electrode is disposed between those two gate electrodes 38. An interval between the n$^+$ layer 36 and the gate electrode 38 adjacent to the n$^+$ layer 36 is about 0.5 μm. An interval between the gate electrodes and the n$^+$ layer as well as the width of the n$^+$ layer can be arbitrarily designed. However, that the interval between the gate electrodes and the n$^+$ layer is made shorter to the degree that can maintain the withstand voltage is advantageous from the viewpoint of the insertion loss at the time of switch operation, and a standard interval between the gate electrodes and the n$^+$ layer is 0.5 μm. Also, the width of the n$^+$ layer is advantageously made thinner from the viewpoint of reducing the insertion loss, and a standard width of the n$^+$ layer is about 0.5 μm from the viewpoint of a processing accuracy. The key point of the present invention is to feed electricity to the n$^+$ layer that extends in a direction of the gate width. However, because a current hardly flows in the n$^+$ layer, the resistance of the n$^+$ layer does not need to be largely lowered. Accordingly, in the case of using a normal n$^+$ layer having a sheet resistance of 50Ω/□, it is sufficient that the width is about 0.5 μM. The same is applied to a case of the multi-gate element having at least three gate electrodes between the ohmic electrodes. The layer between the gate electrodes is not limited to the n$^+$ layer but can be broadly set to the conductive region. The material of the conductive region is set assuming that a current hardly flows in the conductive region as described above.

The above description is given of the main manufacturing process of the field effect transistor. Thereafter, a resistor element and a capacitor element are integrated and formed on the substrate 29, necessary wirings are arranged, and a passivation film is finally formed, to thereby finalize a process of a main surface of the chip (element formed surface). Finally, the thickness of the substrate is appropriately thinned to about 100 μm, and the substrate is cut off, to thereby complete a chip.

The field effect transistor that is manufactured in the above manufacturing process is pHEMT. However, the present invention is not limited to this process but may be, for example, a distortion ease HEMT (hereinafter referred to as "mHEMT": metamorphic HEMT. Hereinafter, a process of manufacturing the switching element in the case where the field effect transistor is mHEMT will be described.

In FIG. 2, a layer that continuously or stepwise increases an InAs mixed crystal ratio of the InAlAs layer from 0 to a desired value is inserted as the buffer layer 30, and the dislocation caused by the lattice constant difference of crystal is closed in the buffer layer 30. The degree of an increase in the InAs mixed crystal ratio is determined according to the composition of an InGaAs channel to be used. In this example, the InAs mixed crystal ratio of the InGaAs channel is about 0.4, and the InAs mixed crystal ratio of the buffer layer 30 also increases to about 0.4. The electron supply layer 31 is not inserted in this manufacturing process.

The channel layer 32 is formed by sequentially stacking an non-doped InGaAs layer that is 200 Å in the thickness (InAs mixed crystal ratio is about 0.4), and an non-doped InAs layer that is 20 Å in the thickness as a spacer layer (InAs mixed crystal ratio is about 0.4).

The electron supply layer 33 is formed by an n$^+$ InAlAs layer that is 100 Å in the thickness (InAs mixed crystal ratio is about 0.4), and impurity ions having the n conduction type (for example, silicon ions) are introduced into the electron supply layer 33 with the density of about $3\times10^{18}$ cm$^{-3}$.

The Schottky layer 34 is formed of an n$^+$ type InAlAs layer that is about 330 Å in the thickness (InAs mixed crystal ratio is about 0.4), and impurity ions having the n conduction type (for example, silicon ions) are introduced into the Schottky layer 34 with the density of about $2\times10^{16}$ cm$^{-3}$.

The interlayer film 35 is formed of an n$^+$ type InP layer that is about 50 Å in the thickness, and impurity ions having the n conduction type (for example, silicon ions) are introduced into the interlayer film 35 with the density of about $5\times10^{18}$ cm$^{-3}$.

The n$^+$ layer (n type cap layer) 36 is formed of an n$^+$ type InGaAs layer that is about 1400 Å in the thickness (InAs mixed crystal ratio is about 0.4), and impurity ions having the n conduction type (for example, silicon ions) are introduced into the n$^+$ layer 36 with the density of about $5\times10^{18}$ cm$^{-3}$.

Figure 3:
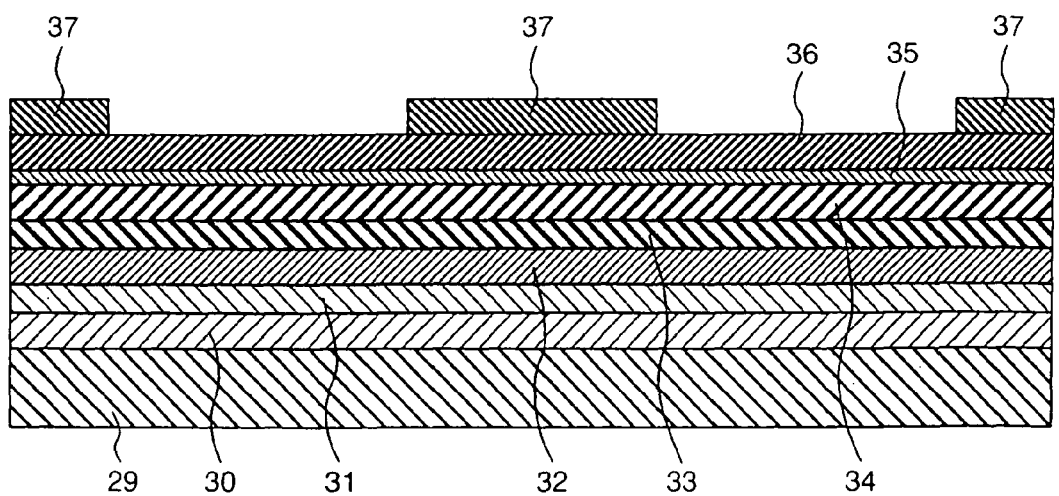
FIG. 3 is a second sectional view for explaining the manufacturing process according to the first embodiment.

Subsequently, after the ohmic electrode 37 has been formed (FIG. 3), the n$^+$ layer 36 and the interlayer film 35 at portions where the gate electrodes are formed are removed as with the pHEMT (FIG. 4). The gate electrodes 38 are then formed (FIG. 5). Each of the gate electrodes 38 is formed of a metal layer with Pt as the lowest layer (a metal layer obtained by sequentially stacking Pt, Ti, Pt, and Au). The thickness of Pt in the lowest layer is about 50 Å. The Pt layer reacts with the Schottky layer 34 and embedded in the Schottky layer 34 in the subsequent heating process. In the mHEMT, because the height of the Schottky barrier is sufficiently heightened to suppress a leak current, a Pt gate that obtains the high Schottky barrier and is large in the work function has been used often. This Pt gate is employed in this manufacturing process. That is, in the switch circuit using the mHEMT, the Pt gate is suitable from the viewpoint of reducing the leak current of the gate electrodes. In addition, the Pt that obtains the high Schottky barrier and is large in the work function prevents from a problem on the voltage dependency of the OFF capacity from which the embedded gate using Pt suffers from, with the result that the Pt gate is effective to the present invention.

The intervals between the gate electrodes 38 and the n⁺ layer 36, and the width of the n⁺ layer 36 are set to about 0.5 μm as in the case of the above manufacturing process, respectively.

The mHEMT formed in this manufacturing process is larger in the electron mobility than the pHENT by 20% or more. For that reason, the ON resistance Ron of the device is reduced, and the insertion loss in the switch circuit is reduced. The problem on the voltage dependency of the OFF capacity which is liable to lead to a problem by using the Pt gate can be also prevented, and the harmonic distortion can be also suppressed to a lower level.

The above description is given of the switching element due to the pHEMT and the mHEMT using GaAs. However, the present invention can be applied to other field effect transistor switching elements, likewise. For example, the present invention is applicable to a field effect transistor switching element using a GaN or InGaN layer as the channel layer.

Figure 6:
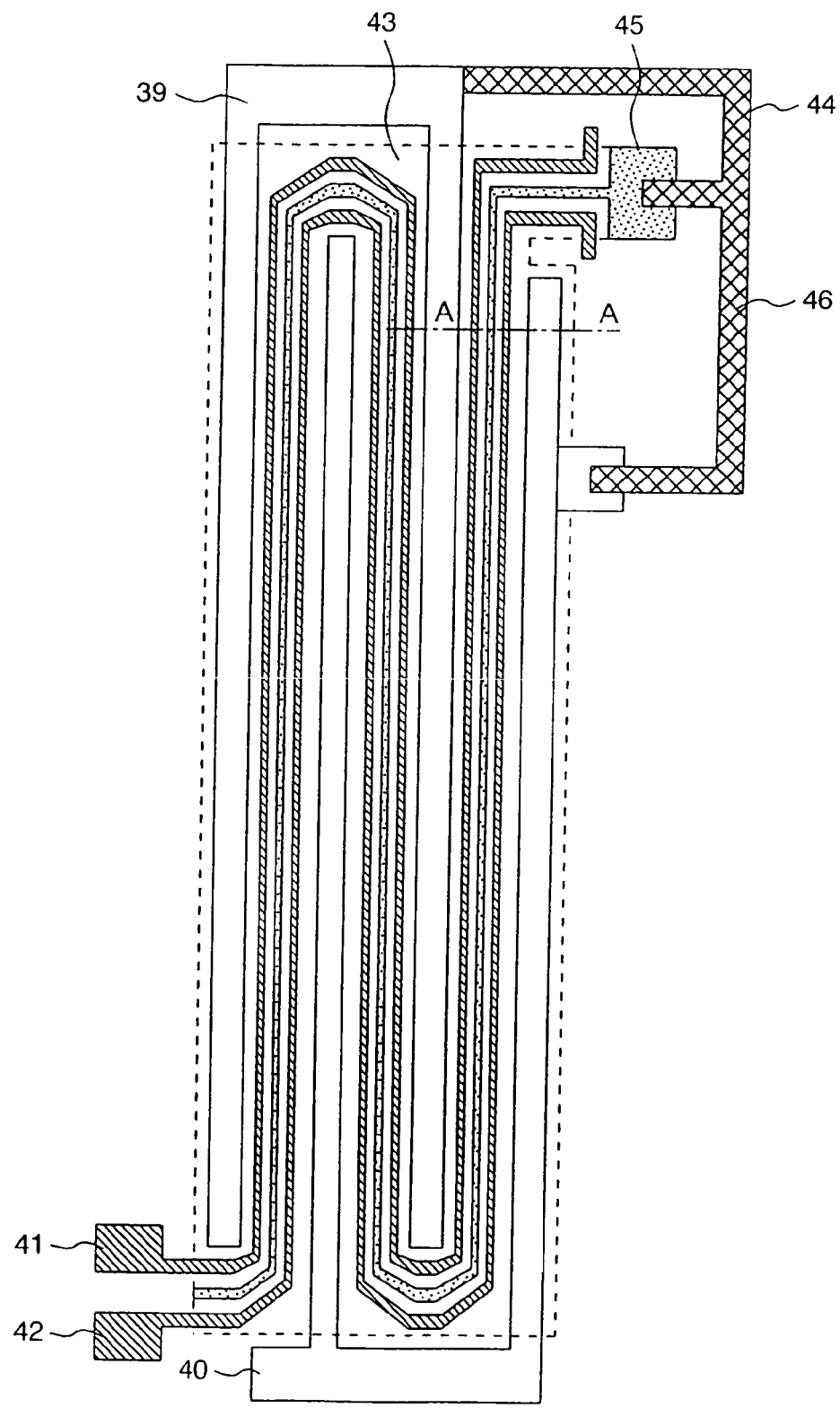
FIG. 6 is a plan view for explaining a switching element according to a second embodiment of the present invention.

FIG. 6 shows a second embodiment of the present invention. This embodiment is concerned with a switching element having a larger gate width as compared with the first embodiment. The manufacturing process is identical with that in the first embodiment.

Referring to FIG. 6, the ohmic electrodes 39 and 40 which are 5 μm in the width are so arranged as to be engaged with each other in the form of comb teeth. The gate electrodes 41 and 42 which are 0.5 μn in the gate length are formed in the form of a meander so as to grovel between the comb teeth in such a manner that the gate electrodes 41 and 42 that are 0.5 μm in the gate length keep the inter-gate distance 1.5 μm and the n⁺ layer 45 which forms the n⁺ electrode is interposed between the gate electrodes 41 and 42. In this case, the distances between the ohmic electrode 39 and the gate electrode 41 and between the ohmic electrode 40 and the gate electrode 42 are 1 μm, respectively. The distances between the n⁺ layer 45 and the gate electrodes 41, 42 are 0.5 μm, respectively.

One ends of the gate electrodes 41 and 42 are thickened to 3 to 5 μm in the length because of the connection with to the wirings and the bias supply resistors. The other ends of the gate electrodes 41 and 42 extend to the outsides of the ohmic electrodes, and the gate electrodes 41 and 42 outside of the ohmic electrodes extend in directions different from those of the gate electrodes 41 and 42 insides of the ohmic electrodes. The isolation region 43 is so formed as to include that portion.

This structure makes it possible to thicken the width of the n⁺ electrode 45 more than 0.5 μm outside of the ohmic electrodes. Accordingly, an area of the n⁺ layer 45 that is surrounded by the gate electrodes 41 and 42 that extend in the different directions and the isolation region 43 can ensure a sufficient area to connect the resistor. The width of the n⁺ electrode 45 at that portion is normally about 3 μm. The ohmic electrode 39 and the n⁺ layer 45 are connected by the potential stabilization resistor 44, and the ohmic electrode 40 and the n⁺ layer 45 are connected by the potential stabilization resistor 46.

In the above structure, the gate electrodes 41 and 42 are interposed by the ohmic electrodes 39 and 40 at three times, separately, whereby the three switching elements one of which is shown in FIG. 1A are connected in series. As a result, the total gate width increases three times. Even if the number of comb teeth of the ohmic electrodes 39 and 40 is increased to further increase the gate width, it is sufficient that the number of nodes between the n⁺ electrode 45 and the potential stabilization electrodes 44, 46 is at least one. In a conventional example shown in FIG. 18, the number of potential stabilization resistors is increased in proportion to the number of parallel. However, in the present invention, the number of potential stabilization resistors is not increased. Therefore, the above manner makes it possible to suppress an increase in the area to the minimum with respect to an increase in the gate width while suppressing the inter-gate distance.

Figure 18:
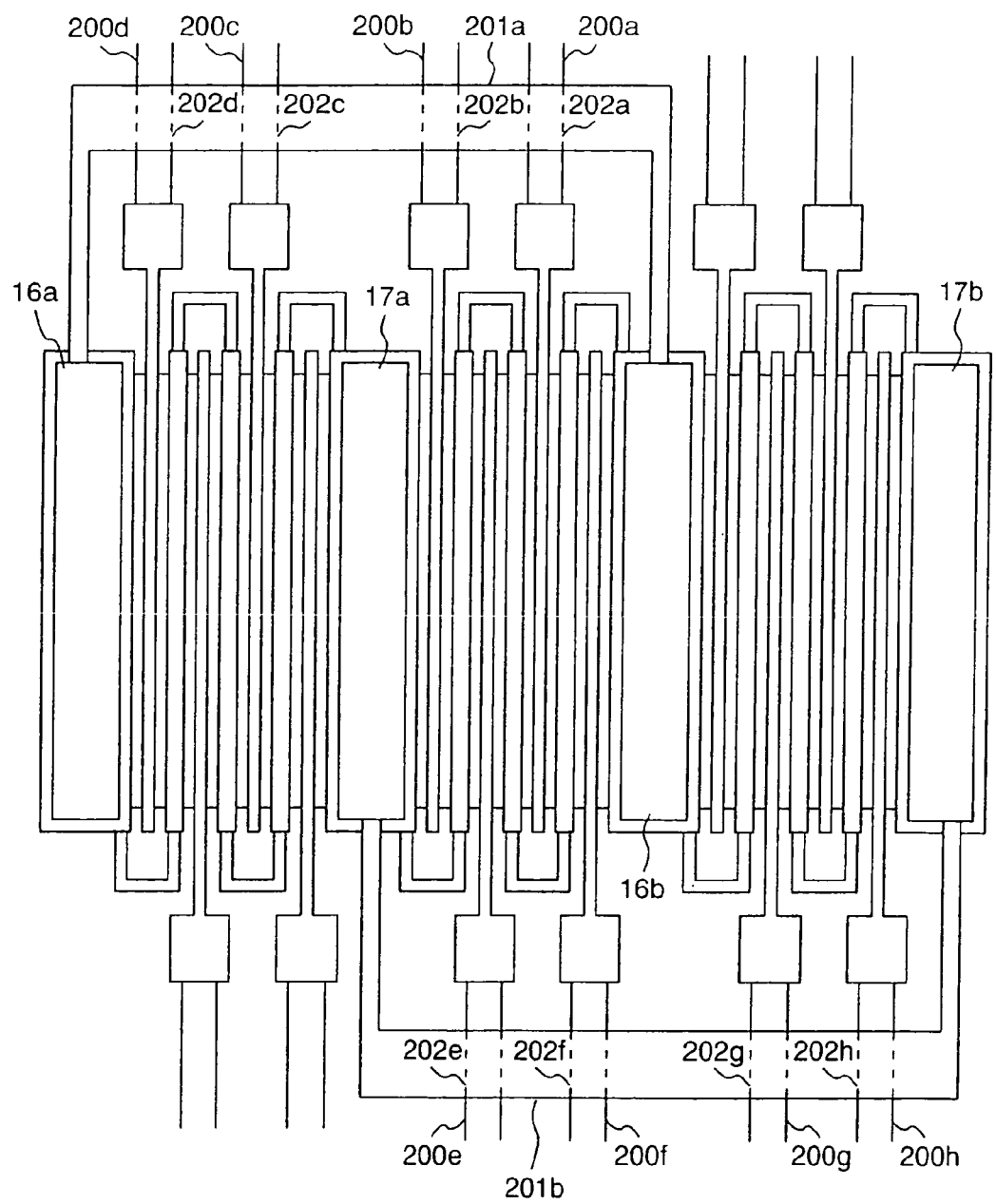
FIG. 18 is a plan view for explaining a problem on an increase in the capacity in a conventional switching element.

In addition, the above structure has no intersection portion at which the lead lines of the gate electrodes and the mutual connection lines of the ohmic electrodes intersect with each other as in the conventional structure shown in FIG. 18. Accordingly, there is no increase in the capacities between the gate electrodes and the ohmic electrodes, and an increase in the insertion loss and the isolation deterioration due to an increase in the capacity when the switching elements are in a nonconductive state is prevented.

Figure 7:
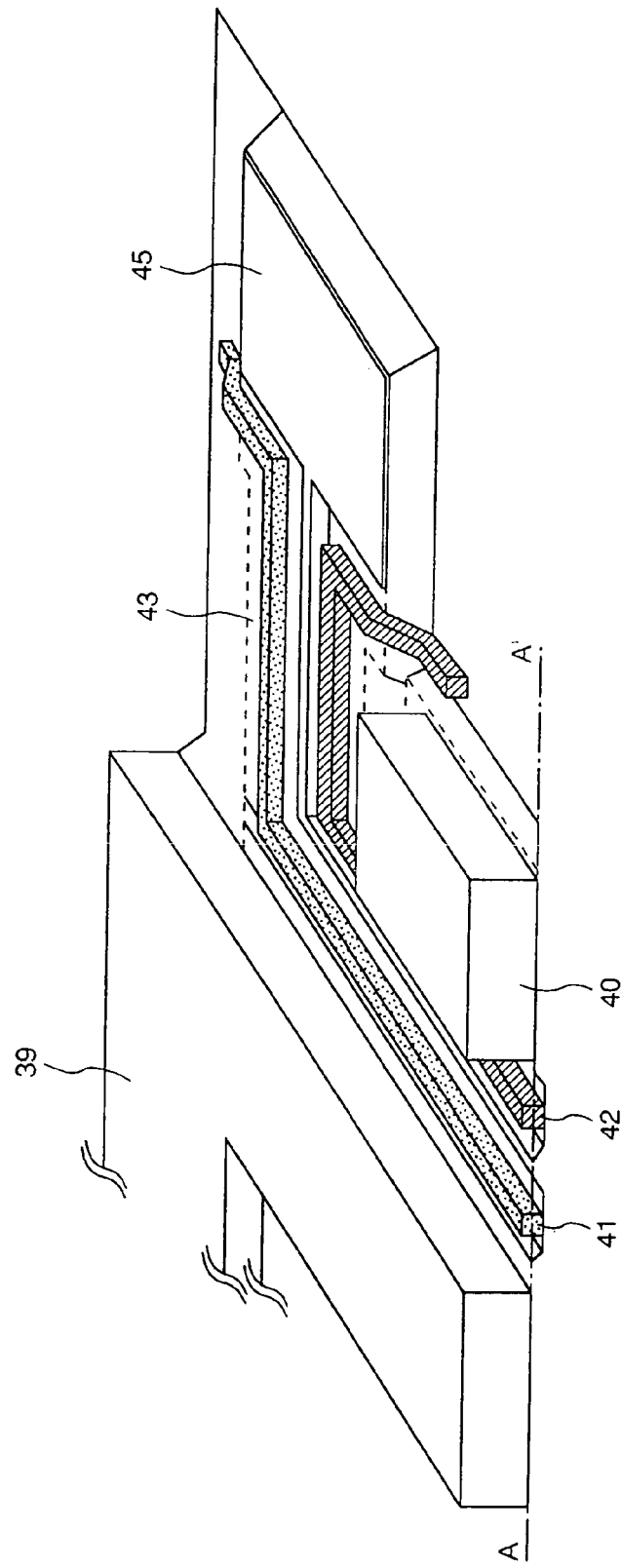
FIG. 7 is a perspective view for explaining a switching element according to the second embodiment of the present invention.

FIG. 7 shows a perspective view showing the section of FIG. 6 taken along a line A-A. Numeral reference in FIG. 7 coincide with that in FIG. 6. The potential stabilization resistor elements 44 and 46 are omitted from the drawing. The outside of the isolation region 43 is formed with an oblique surface in the vicinity of the region because an upper surface of the semiconductor is cut. The gate electrodes 41 and 42 extend beyond the oblique surface, to thereby allow the regions between the gate electrodes and the ohmic electrodes to be separated from the regions between the gate electrodes and the n⁺ electrodes.

Figure 8A:
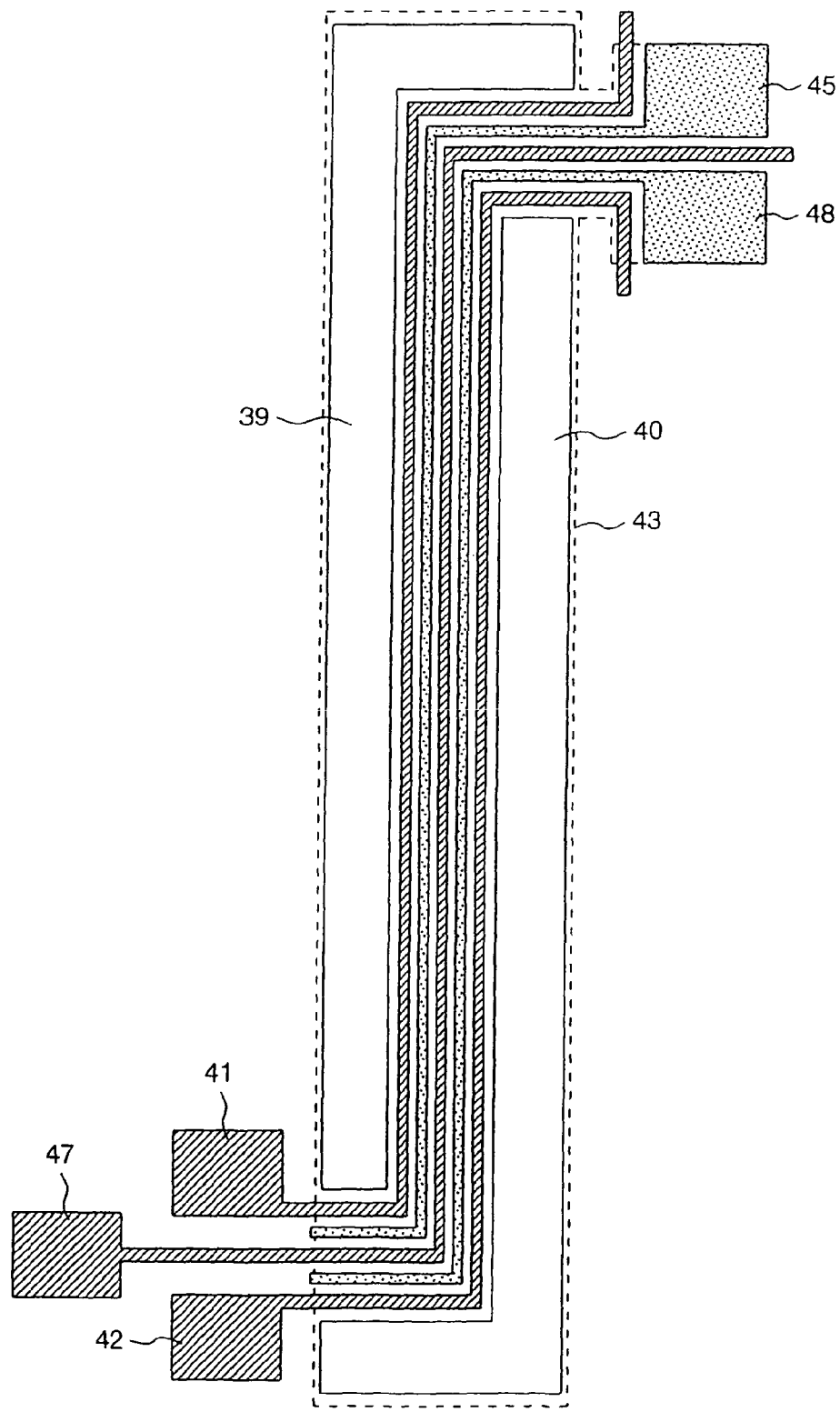
FIG. 8A is a plan view for explaining a switching element according to a third embodiment of the present invention.
Figure 8B:
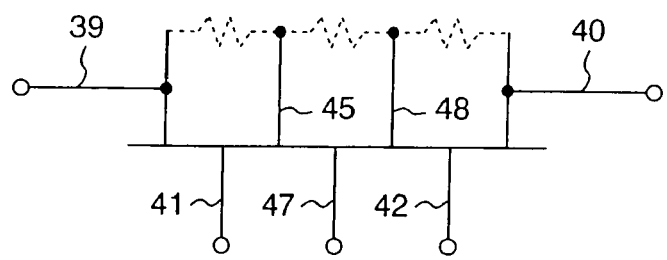
FIG. 8B is a circuit diagram for explaining the switching element according to the third embodiment of the present invention.

FIGS. 8A and 8B show a third embodiment of the present invention. This embodiment is concerned with a triple gate element having three gate electrodes. The manufacturing process is basically identical with that in the first embodiment although the formed gate electrodes and n⁺ layers are different from those in the first embodiment.

In an example of the layout shown in FIG. 8A, the gate electrodes 41, 42, and 47 are arranged between the ohmic electrodes 39 and 40, and the n⁺ layers 45 and 48 are disposed between the respective gate electrodes. In this example, the overall ohmic electrodes are covered in the isolation region 43, different from the case of the second embodiment shown in FIG. 6. As a result, because the meander portion also acts as the field effect transistor, the ON resistor can be reduced in the same element area. The gate electrodes 41 and 42 extend in the different directions outside of the ohmic electrodes, and the gate electrodes 47 extend as they are, to thereby increase the distance between the gate electrodes. For that reason, the wider n⁺ layers 45 and 48 are formed in the regions that are surrounded by the gate electrodes 41, 42, and 47 and the element separation region 43. The wider n⁺ layer 45 and the ohmic electrode 39, the n⁺ layer 45 and the n⁺ layer 48, and the n⁺ layer 48 and the ohmic electrode 40 are connected to each other by the potential stabilization resistors (not shown), respectively, to thereby make the ohmic electrodes and the gate electrodes, and the gate electrodes and the n⁺ layer identical in the potential with each other. As a result, the potentials of the gate electrodes are stabilized. FIG. 8B shows a circuit diagram showing a switching element according to this embodiment.

Figure 9:
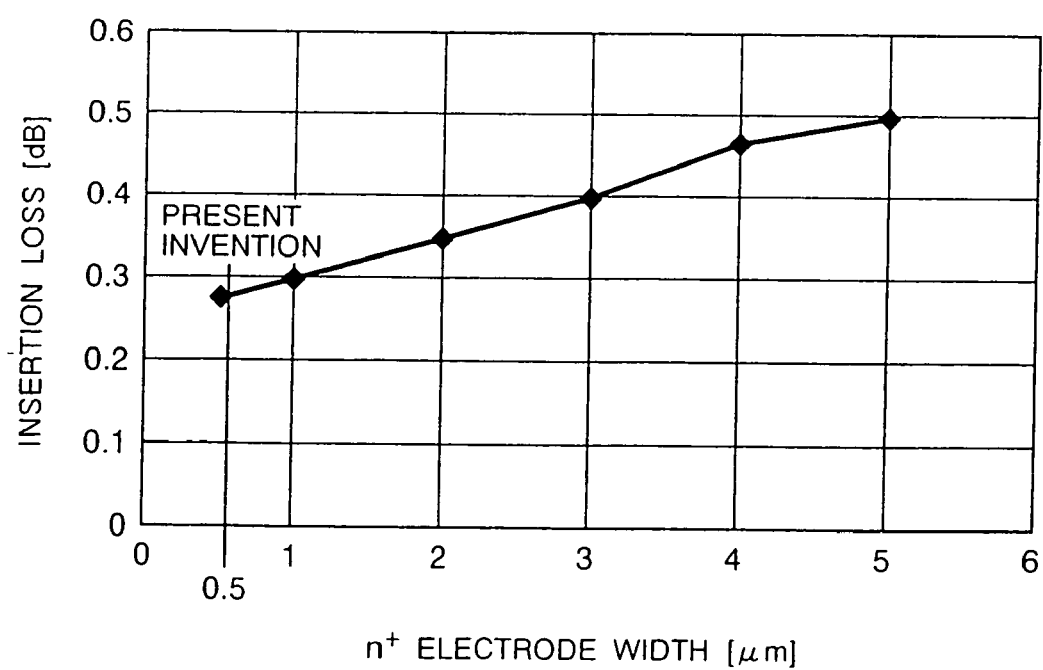
FIG. 9 is a graph for explaining a change in insertion loss when a width of an $n^+$ layer is changed to change an inter-gate distance.

FIG. 9 shows the results of calculating a change in the insertion loss when the switching elements of the present invention are rendered conductive, and the distance between the gates is changed. The switching elements used for calculation are two dual gates. The gate width is 1 mm, the distances between the ohmic electrodes and the gate electrodes are 1 μm, and the distances between the gate electrodes and the n$^+$ electrodes are fixed to 0.5 μm, respectively. The n$^+$ electrode width is changed, to thereby change only the distances between the gate electrodes.

In the first, second, and third embodiments, the inter-gate distance is 1.5 μM, and the n$^+$ electrode width is 0.5 μm. The corresponding insertion loss is about 0.28 dB. When the n$^+$ electrode width increases to 3 μm, the loss increases to 0.4 dB, and the n$^+$ electrode width is further set to 5 μm, the loss increases to 0.5 dB. As a result, it is proved that when the distance between the gate electrodes is made minimum, the ON resistance of the transistor is minimized, and the insertion loss is minimized.

As described above, according to the present invention, the withstand power property can be improved without an increase in the insertion loss and the element area. A reduction in the harmonic distortion which is another important advantage will be described below.

Figure 10A:
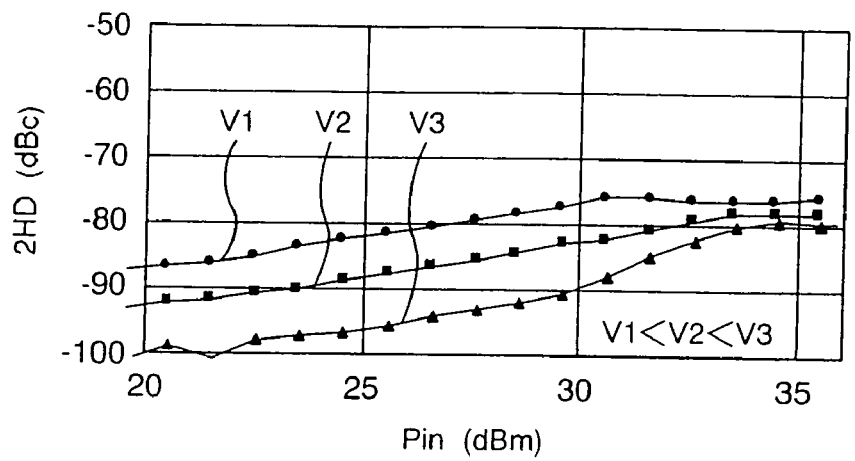
FIG. 10A is a graph showing an actual measurement result of a second harmonic distortion when electricity is fed to the n+ layer.
Figure 10B:
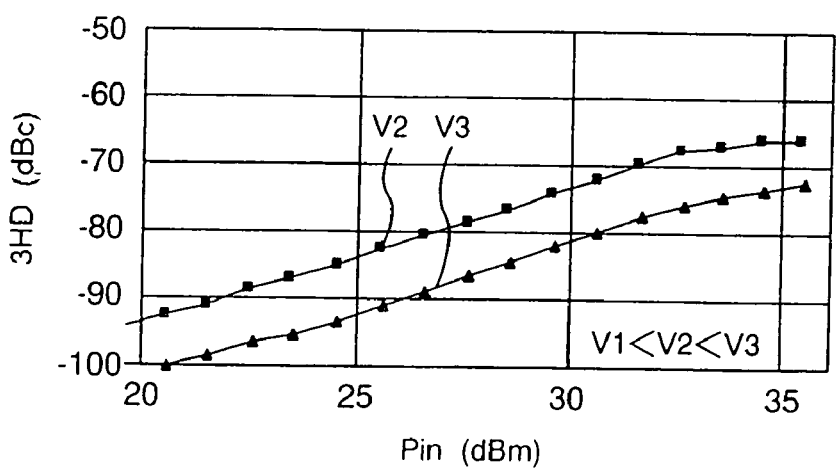
FIG. 10B is a graph showing an actual measurement result of a third harmonic distortion when electricity is fed to the n+ layer.
Figure 10C:
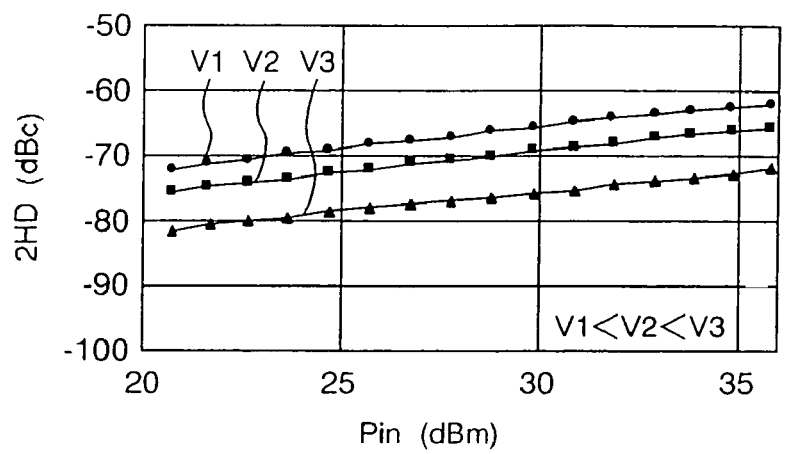
FIG. 10C is a graph showing an actual measurement result of the second harmonic distortion when electricity is not fed to the n+ layer.
Figure 10D:
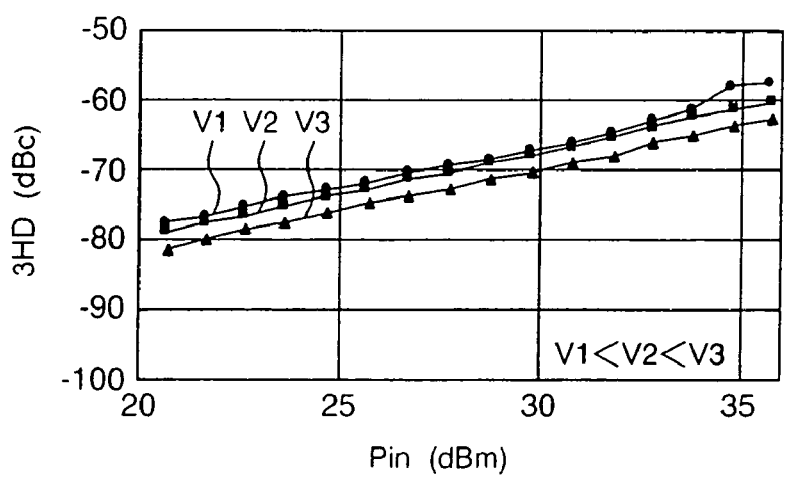
FIG. 10D is a graph showing an actual measurement result of the third harmonic distortion when electricity is not fed to the n+ layer.

FIGS. 10A to 10D show the real measurement results of input power (Pin) dependency of the second harmonic distortion (2HD) and the third harmonic distortion (3HD) when the switching elements that supply electricity to the n$^+$ electrodes according to the present invention shown in FIG. 1A, and the general switching elements that do not feed electricity to the n$^+$ electrodes in the switch circuit shown in FIG. 1A, that is, which is not stabilized in the inter-gate potential, are connected to a transmission path in parallel in the nonconductive state, respectively. The frequency is set to 1910 MHz. FIGS. 10A and 10B show the second harmonic distortion and the third harmonic distortion of the switching element according to the present invention, respectively, and FIGS. 10C and 10D show the second harmonic distortion and the third harmonic distortion of the general switching element, respectively.

Figure 11:
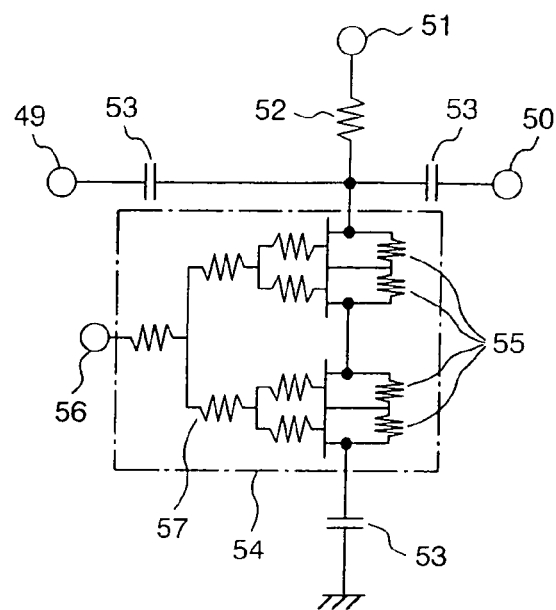
FIG. 11 is a circuit diagram showing a measuring circuit using the switching element when electricity is fed to the n+ layer.

FIG. 11 shows a measurement circuit diagram showing the harmonic distortion by using the switching element of the present invention. A switching element 54 is structured by two stages of dual gates that feed electricity to the n$^+$ electrodes. The switching element 54 having the two stage structure of the dual gates according to the present invention is connected between a transmission path extending between an input terminal 49 and an output terminal 50, and the ground. A terminal 51 and a terminal 56 are bias supply terminals. A capacitor 53 is used for high frequency coupling, and resistors 52 and 57 are used for high frequency leakage prevention and d.c. current coupling, respectively. Resistors 55 that are connected between the ohmic electrodes through the n$^+$ electrodes between the gate electrodes equally effects bias to the respective stages.

Figure 12:
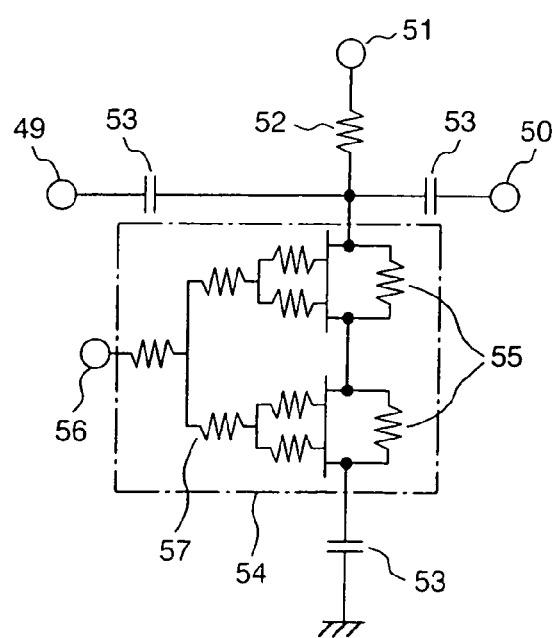
FIG. 12 is a circuit diagram showing a measuring circuit using the switching element when electricity is not fed to the n+ layer.

FIG. 12 shows a measurement circuit diagram showing a harmonic distortion using the general switching element. The switching element 54 is structured by two stages of dual gates that do not feed electricity to the n$^+$ electrodes. Resistors 55 are connected between the ohmic electrodes not through the n$^+$ electrodes, different from the switching element shown in FIG. 11.

As shown in FIGS. 10A to 10D, the switch of the present invention is small in the harmonic distortion because the input voltage is low, and also small in the harmonic distortion at the time of 35 dBm input. The switching element of the present invention and the general switching element further improve the harmonic distortion as the bias voltage is made higher to V1, V2, and V3. However, in the switching element according to the present invention, it is confirmed that a change in the harmonic distortion with respect to the bias is large, and the degree of the improvement in the harmonic distortion is large.

An improvement in the harmonic distortion of the switching element in the nonconductive state will be described with reference to FIGS. 13 and 14.

Figure 13:
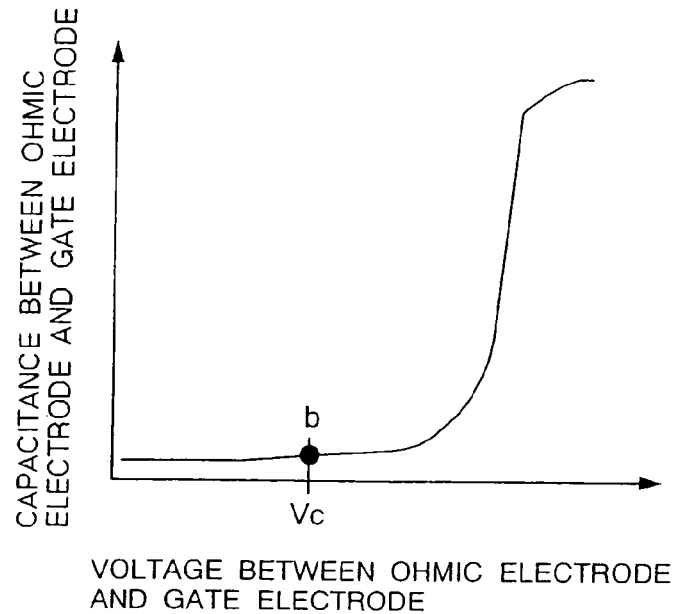
FIG. 13 is a graph for explaining a voltage dependency of a capacity between an ohmic electrode and a gate electrode.
Figure 14:
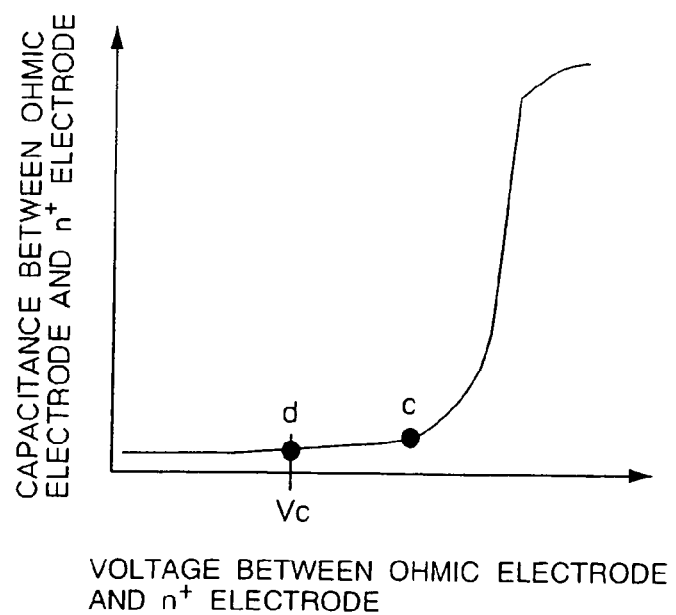
FIG. 14 is a graph for explaining a voltage dependency of a capacity between the gate electrode and the n+ layer.

FIG. 13 shows a dependency of the capacity between the ohmic electrode and the gate electrode on a voltage between the ohmic electrode and the gate electrode, and FIG. 14 shows a dependency of the capacity between the gate electrode and the n$^+$ electrode disposed between the gate electrodes on a voltage between the gate electrode and the n$^+$ electrode. In both of those figures, the capacity is lessened as the voltage drops at a voltage that is lower than a voltage that allows the transistor to turn off. Also, a change in the capacity becomes larger as the voltage approaches the OFF voltage more. The voltage dependency taken by the capacity at the time of OFF leads to the harmonic distortion that is generated from the transistor of the OFF state. In particular, in the case of the Pt embedded type gate electrode which is applied in the first, second, and third embodiments, there is a tendency to increase the dependency of the OFF capacity on the voltage because the bottom surface of the gate electrode is not completely flat. That is, there is a tendency to increase the harmonic distortion of the transistor which is in the OFF state. However, the Pt embedded type is advantageous to a reduction in the insertion loss and a reduction in the harmonic distortion in the transistor which is in the ON state because a resistance of a parasitic portion of a gate side is reduced.

In the circuit shown in FIG. 12, that is, in the case where there is a portion where the potential is unstable because electricity is not fed to the n$^+$ electrode, when the OFF voltage of the switch which is Vc is applied to the terminal 51, a portion between the ohmic electrode and the gate electrode is biased to a point "b" in FIG. 13. However, a portion between the n$^+$ electrode and the gate is biased to a point "c" in FIG. 14, to thereby develop a voltage close to a voltage at which the channel turns off. For that reason, the dependency of the OFF capacity on the voltage is large, and a large harmonic distortion is generated when the high frequency power passes therethrough.

In the switching element according to the present invention as shown in FIG. 11, because electricity is fed to the n$^+$ electrode, a portion between the ohmic electrode and the gate electrode is biased to a point "b" in FIG. 13 and a portion between the gate electrode and the n$^+$ electrode is biased to a point "d" in FIG. 14. For that reason, in any cases, the generation of the harmonic distortion is suppressed because biasing is conducted in a region where the dependency of the OFF capacity on the voltage is small. That is, even in the element having the Pt embedded type gate electrode that is large in the dependency of the OFF capacity on the voltage as in this embodiment, it is possible to get the lower insertion loss and the low distortion in the ON state which are advantages of the Pt embedded type while the generation of the harmonic distortion is suppressed. Also, as shown in FIGS. 13 and 14, the dependency of the OFF capacity on the bias is lessened gradually as the bias is larger, and the OFF-operation region is increased, to thereby improve the harmonic distortion and improve the withstand power property.

In this embodiment, the transistor having the Pt embedded type gate is described. However, even in the case of using a gate that does not conduct embedding, the harmonic distortion is suppressed while an increase in the insertion loss and the chip area is suppressed by application of the present invention which feeds electricity to the n$^+$ electrode, likewise. Also, in addition to the suppression of the harmonic distortion, there is advantageous in that it is difficult to lose the OFF state at the time of inputting a large power, and the withstand power property is improved.

Subsequently, a magnitude relation between a resistor of the n+ electrode and the potential stabilization resistor that connects the n+ electrode and the ohmic electrode will be described. For example, in the case where the total gate width is 2 mm, when the sheet resistance of the n+ layer which is the n+ electrode is 50Ω/□, the resistance of the n+ layer which is 0.5 μm in the width and 2 mm in the length becomes 200 KΩ. However, in the case where only one feeding point is formed on one end of the n+ layer, an effective resistance with respect to the field effect transistor is considered to be ½ of the n+ layer resistance, that is, 100 kΩ.

Incidentally, Japanese Patent Laid-Open No. 2000-101032 discloses a method of connecting a potential stabilization resistor larger in the resistance value than the n+ layer between the n+ layer and the ohmic electrode. However, in the case where the n+ layer becomes 100 kΩ, the value exceeds the potential stabilization resistor. The resistor that exceeds 100 kΩ becomes too large in the pattern area, and the element is impeded from being downsized. On the other hand, the value of the potential stabilization resistor is normally about 10 kΩ which is the degree that can sufficiently ensure a high resistance in the high frequency operation of the switching element. In this case, the effective resistance of the n+ layer is made smaller than 10 kΩ. However, in this case, the width of the n+ layer must be set to 5 μm or more, which causes the insertion loss as the switch to be increased. Also, this is disadvantageous from the viewpoint of an increase in the occupied area of the transistor.

In this case, the resistor of the n+ layer may be determined as a resistor whose upper limit resistance can ignore a voltage drop caused by a current that flows in the n+ layer. A current that flows in the n+ layer when the transistor is in the OFF state is a gate leak current. Normally, doping in the semiconductor is designed so that a reverse gate leak current becomes about 1 μA/mm or lower. It is assumed that the gate leak current per unit gate width is Ig, the gate width is Wg, and the resistance of the n+ layer per a unit length in the gate width direction is R. Also, it is assumed that the length of the n+ layer is equal to the gate width since the former is substantially equal to the latter. In the case where electricity is fed to one end of the n+ layer, a voltage drop Vdrop due to Ig in the gate width is expressed by the following expression:

$$V\text{drop} = (½) \cdot R \cdot I \cdot Wh^2 = (R \cdot Wg/2) \cdot Ig \cdot Wg \cdot \text{Reff} \cdot Ig\text{total}$$

Reff=R·WG/2 is the effective resistance described above.

Figure 19:
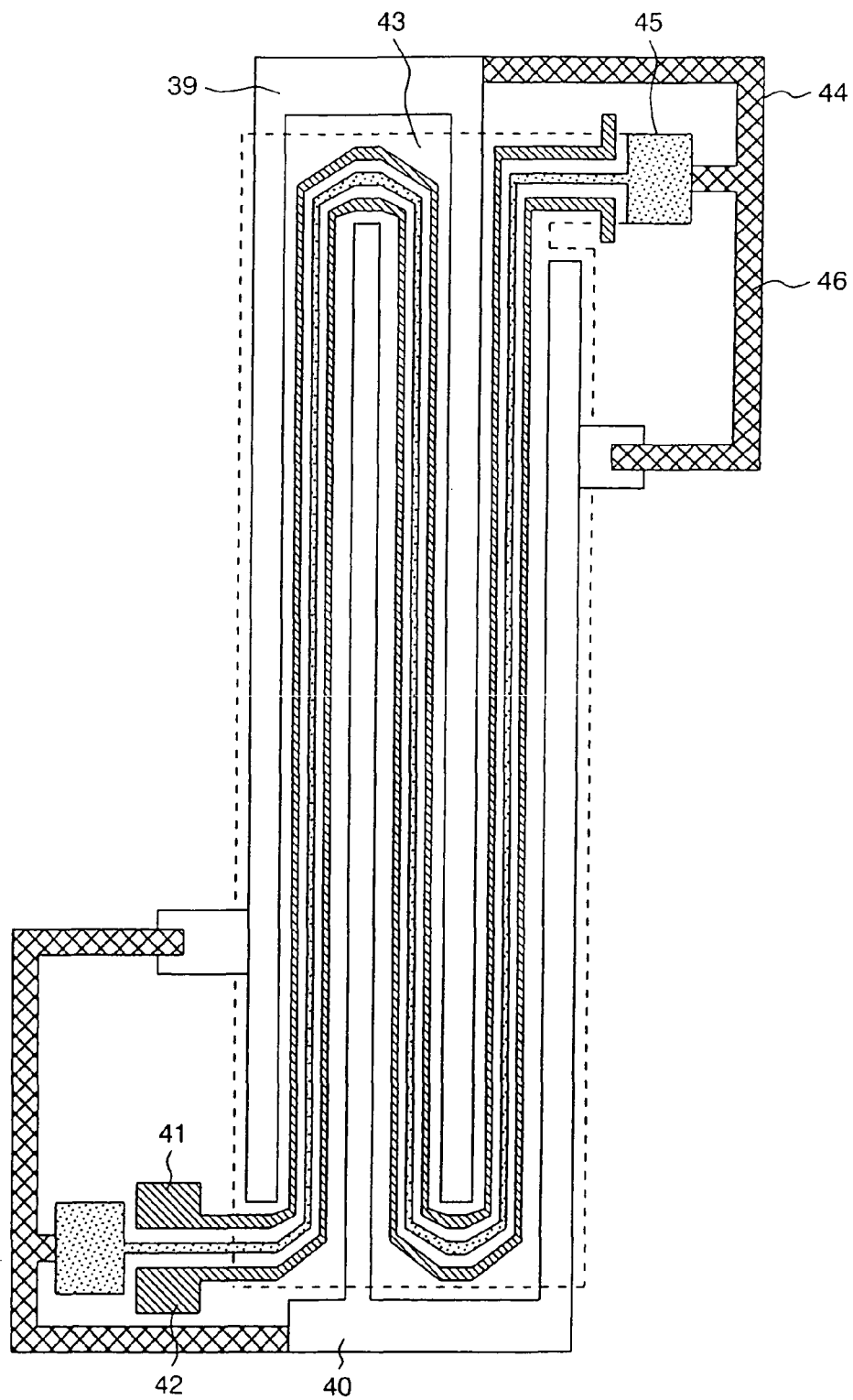
FIG. 19 is another plan view for explaining the switching element according to the second embodiment of the present invention.

In this example, when the sheet resistance of the n+ layer is set to 50Ω/□, and the width is set to 0.5 μm, the resistance R per the unit length in the gate width direction becomes 10 kΩ/mm. When Ig=1 μA/mm is satisfied, the Vdrop becomes 0.2 V when the gate width=2 mm is satisfied. When Wg=1 mm is satisfied, Vdrop becomes 0.05 V which is ¼ of 0.2 V. Since the OFF state of the field effect transistor switch is usually set to a high voltage that is ranged from about 1 V to 2V normally due to Vth, when Vdrop is set from about 0.05 to 0.2 V, the off state is sufficiently allowed with respect to the voltage of from about 1 V to 2 V due to the Vth. That is, it is exhibited that the resistance 10 to 20 1d/when the length of the n+ layer is set to 1 to 2 mm may be larger than about 10 kΩ which is the normal resistance of the potential stabilization resistor, and it is exhibited that the width is preferably suppressed to about 0.5 μm even when the resistance of the n+ layer is large. In the case where the voltage drop cannot be ignored because the gate width is further increased, the connection of the potential stabilization resistors between the n+ layer and the ohmic electrode is disposed on not only one of the gate electrodes as in the second embodiment shown in FIG. 6, but also both of the gate electrodes as shown in FIG. 19, thereby making it possible to suppress Vdrop to the minimum value.

In the above embodiment, the description is given of a structure (recess gate structure) in which the n+ layer (cap layer) is disposed on both sides of the gate electrode by using the pHEMT transistor or the mHEMT transistor. However, the present invention is not limited to a case in which the cap layer is arranged. In the case where the cap layer is not arranged, feeding of electricity between the gate electrodes is conducted on the channel layer disposed on a portion between the gate electrodes. The inter-gate distance may be designed by using the sheet resistance of the channel layer on that portion instead of the sheet resistance of the n+ layer according to the above concept.

Figure 15:
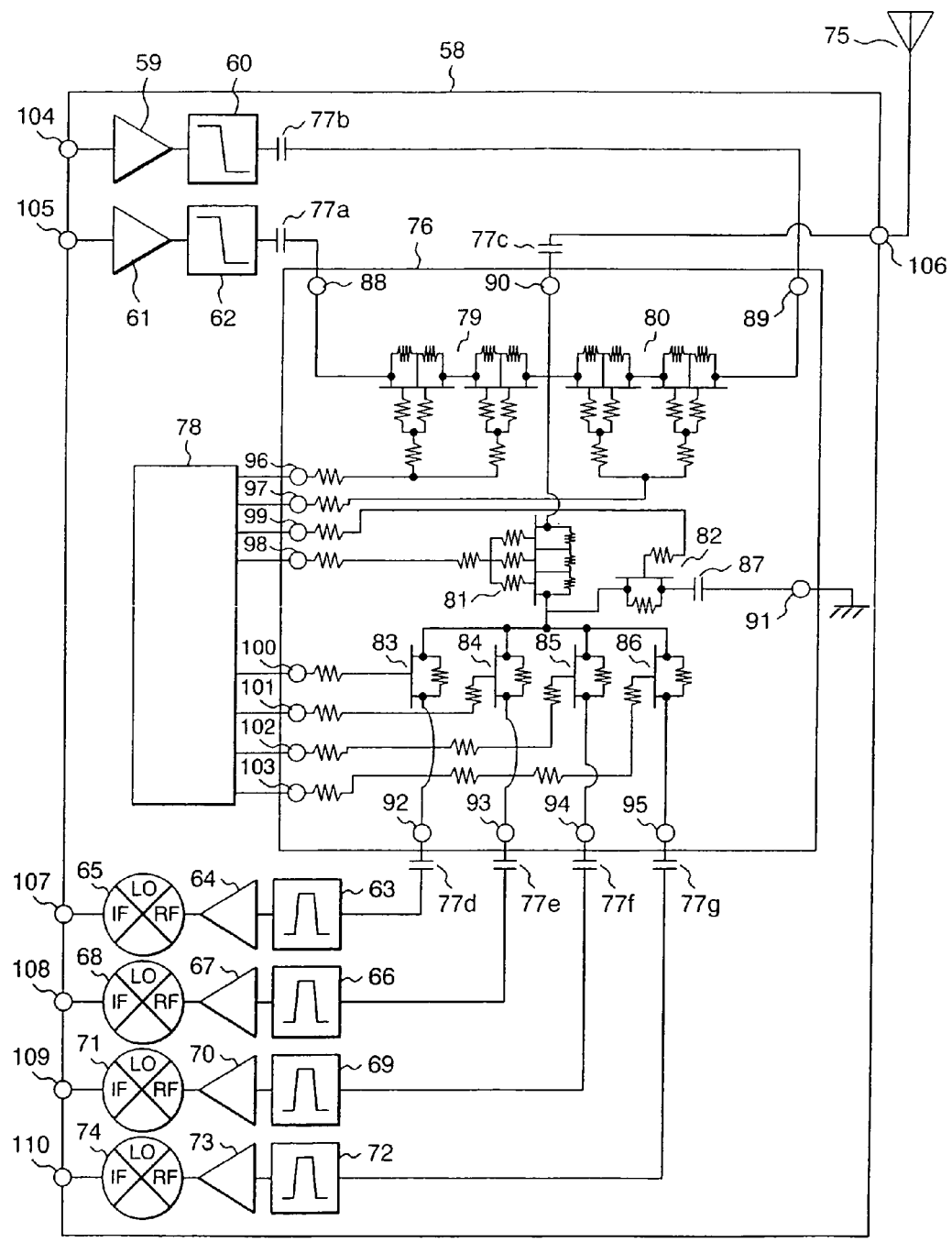
FIG. 15 is a circuit structural diagram for explaining an antenna switch circuit and a radio frequency module according to a fourth embodiment of the present invention.
Figure 16:
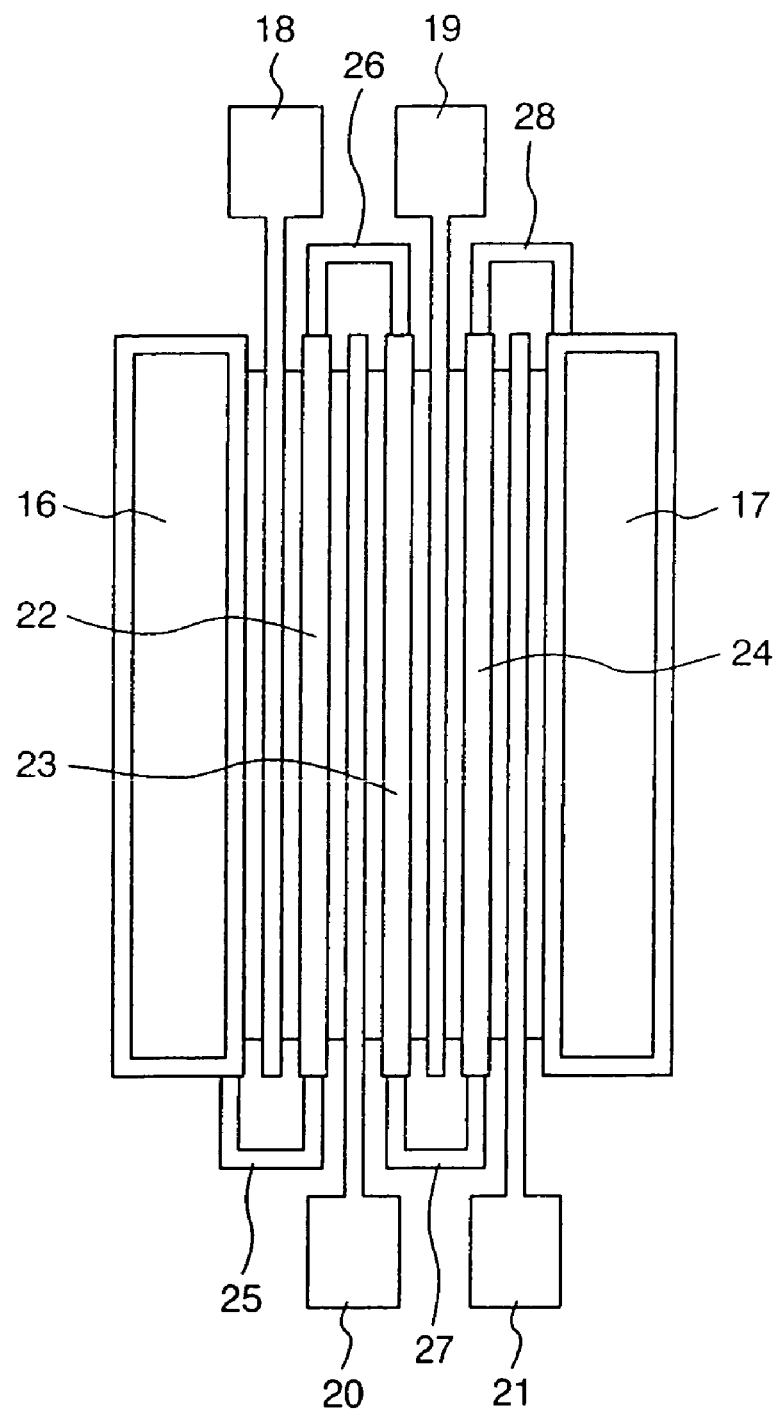
FIG. 16 is a plan view for explaining a conventional switching element.
Figure 17:
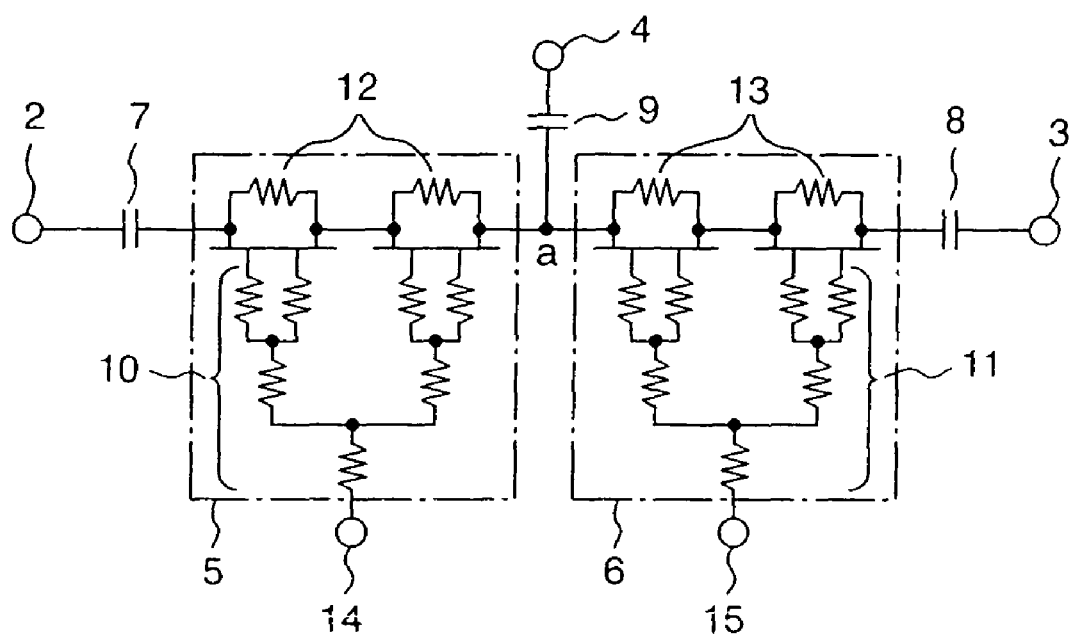
FIG. 17 is a circuit diagram for explaining a general SPDT switch.

FIG. 15 shows a fourth embodiment of the present invention. This embodiment is related to an antenna switch circuit using the switching element of the present invention, and a radio frequency module that is equipped with the antenna switch circuit and used in a cellular phone adaptive to a quad band. Referring to FIG. 15, reference numeral 76 denotes an antenna switch circuit, and 58 is a radio frequency module. The quad band is directed to a band that conforms to four cellular phone standards (communication systems) consisting of GSM (global system for mobile communications) in Europe, and GSM, PCS (personal communication services) and DCS (digital communication system) in U.S. For the sake of description, it is assumed that the GSM in Europe is GSM1, and the GSM in U.S. is GSM2. The radio frequency module 58 is equipped with the respective terminals of one common system (GSM1/2) of transmission and two systems (GSM1 and GSM2) of reception in GSM in order to conform to the cellular phone regulations. Also, the radio frequency module 58 is equipped with the respective terminals of one common system of transmission in PCS and DCS, one system of reception in PCS, and one system of reception in DCS. The GSM is of a 900 MHz band, and PCS and DCS are of a 1800 MHz band.

The antenna switch circuit 76 switches over the above seven systems and one antenna 75. In the antenna switch circuit 76 shown in FIG. 15, reference numerals 79 to 86 denote switching elements, 96 to 103 are control terminals that input control signals for controlling conduction and non-conduction of the switching elements 79 to 86, and 87 is a high frequency coupling capacity. In addition, reference numeral 88 denotes a PCS/DCS transmitting terminal (first terminal), 89 is a GSM transmitting terminal (first terminal), and 90 is an antenna terminal (second terminal). Also, reference numeral 91 denotes an ground terminal, 92 is a GSM1 receiving terminal (third terminal), 93 is a GSM2 receiving terminal (third terminal), 94 is a PCS receiving terminal (third terminal), and 95 is a DCS receiving terminal (third terminal). The ground terminal 91 is connected to a ground plane of the module 58. The switching elements 79 and 80 are formed of the switching elements of the first or second embodiment. The switching element 81 is formed of the switching element of the third embodiment.

In the radio frequency module 58 shown in FIG. 15, reference numeral 104 denotes an input terminal of the GSM transmitted signal, 105 is an input terminal of the PCS/DCS transmitted signal, and 106 is an antenna connection terminal. Also, reference numeral 107 denotes an output terminal of the GSM1 received signal, 108 is an output terminal of the GSM2 received signal, 109 is an output terminal of the PCS received signal, and 110 is an output terminal of the DCS received signal. Also, reference numeral 78 denotes a control circuit that generates a control signal to the control terminals 96 to 103. In addition, reference numerals 59 and 61 are power amplifiers (first amplifier), reference numerals 60 and 62 are low pass filters, and 77a to 77f are high frequency coupling capacities. Also, reference numerals 65, 68, 71, and 74 denote frequency converters, 64, 67, 70, and 73 are low noise amplifiers (second amplifier), and 63, 66, 69, and 72 are SAW (surface acoustic wave) filters. The filters 60 and 62 at the transmission side may be disposed inside of the power amplifiers 59 and 60 as a part of a matching circuit of the power amplifiers 59 and 60.

At the time of transmission, the GSM transmitted signal that is outputted from the external GSM transmitting circuit is inputted to the input terminal 104, and amplified by the power amplifier 59. The high frequency component is removed from the GSM transmitted signal by the low pass filter 60, and the GSM transmitted signal is inputted to the transmitting terminal 89 of the switching element 76. In this situation, the control circuit 78 allows a positive voltage to be applied to the control terminals 97 and 99, and 0 voltage to be applied to the control terminals 96, 98, and 100 to 103, respectively, whereby the switching elements 80 and 82 are rendered conductive and the switching elements 79, 81, and 83 to 86 are rendered nonconductive. As a result, the GSM transmitted signal after being amplified is transmitted from the antenna 75 connected to the antenna connection terminal 106, through the switching element 80 and the antenna terminal 90.

In this situation, the switching elements 80 and 82 are resistively connected with the n$^+$ layers and the ohmic electrodes by application of the present invention, and the interval between the gate electrodes is narrowly set. As a result, the resistance when the switching elements 80 and 82 are conductive is made resistive. Accordingly, the low insertion loss is realized. The low insertion loss of the switching element 82 improves the isolation between the antenna terminal 90 of the antenna switching circuit 76 and the receiving terminals 92 to 95.

Subsequently, a signal that has been outputted from the external PCS/DCS transmitting circuit is inputted to the input terminal 105, and amplified by the power amplifier 61. Then, the high frequency component is removed from the signal by the low pass filter 62, and the signal is inputted to the transmitting terminal 88. In this situation, the control circuit 78 allows the switching elements 79 and 82 to be rendered conductive, and the switching elements 80, 81, and 83 to 86 to be rendered nonconductive, and the signal is transmitted from the antenna 75 that is connected to the antenna terminal 106 through the switching element 79 and the antenna terminal 90.

In this situation, the switching elements 79 and 82 are resistively connected with the n$^+$ layers and the ohmic electrodes by application of the present invention, and the interval between the gate electrodes is narrowly set. As a result, the resistance when the switching elements 79 and 82 are conductive is made resistive. Accordingly, the low insertion loss is realized. As described above, the low insertion loss of the switching element 82 improves the isolation between the antenna terminal 90 of the antenna switching circuit 76 and the receiving terminals 92 to 95.

In particular, because the frequency bands of from 1850 MHz to 1875 MHz are overlapped in the operating frequency with each other in the PCS transmission frequency and the DCS reception frequency, there is an a fear that the SAW filter 72 may be destroyed if the isolation from the transmission side is not sufficiently high when the PCS transmitted signal of the high output is leaked to the DCS receiving terminal 95. However, in the present invention, the SWA filter is not destroyed since the high isolation is realized.

As the operation at the time of reception, the DCS reception will be representatively described. The DCS received signal that has been received by the antenna 75 is inputted to the antenna terminal 90 through the antenna terminal 106. In this situation, the control circuit 78 allows the switching elements 79, 80, and 82 to 85 to be rendered nonconductive, and the switching elements 81 and 86 to be rendered conductive. As a result, after spurious out of the band is removed by the SAW 72, and the noises are lowered, the received signal is amplified by the low noise amplifier circuit 73, converted into an IF signal or a demodulation signal by the frequency converter 74, and then outputted to the output terminal 110.

As described above, according to this embodiment, it is possible to realize an antenna switch circuit and a radio frequency module which are low in the insertion loss in the transmission and reception operation, and obtain the high isolation between the transmission and the reception.

In this embodiment, a positive voltage that is applied to the switching element in the transmission operation is increased to make the bias of the switching element which is in the nonconductive state large with the result that the withstand power property is improved. In addition, because the switching element is biased to a point where the dependency of the capacity on the bias is small, the harmonic distortion is also improved. For that reason, the present invention is also applicable to the communication system that is applied with digital modulation which requires the high linearity such as WCDMA (wideband code division multiplex access), EDGE (enhanced data rates for GSM evolution), or the radio LAN (local area network).

Also, in the case of a cellular phone for single band, the switching elements 82 to 86 are omitted in the antenna switch circuit 76, and needless to say, the transmitter and receiving circuits in the radio frequency module 58 are structured by one system.

According to the present invention, since it is possible to set the inter-gate distance to be smaller so as not to increase the insertion loss, there can be realized the switching element that can stabilize the potential between the gates of the multi-gates without an increase in the insertion loss.

It is further understood by those skilled in the art that the foregoing description is a preferred embodiment of the disclosed device and that various changes and modifications may be made in the invention without departing from the spirit and scope thereof.

What is claimed is:

1. A switching element, comprising:
a field effect transistor which comprises
a Schottky layer commonly forming
two ohmic electrodes disposed alternately to be formed as a source electrode and a drain electrode;
at least two gate electrodes disposed between the two ohmic electrodes and formed so as to grovel between the two ohmic electrodes; and
a conductive region interposed between the adjacent gate electrodes among the at least two gate electrodes and along the adjacent gate electrodes,
a compound semiconductor substrate disposed on a side opposite to a surface in which the two ohmic electrodes, the gate electrodes and the conductive region are formed,
a compound semiconductor channel layer and a compound semiconductor buffer layer, both layers being formed between the Schottky layer and the compound semiconductor substrate, and
resistors each serially connecting one end of the conductive layer to each of the two ohmic electrodes.

2. The switching element according to claim 1, wherein the whole of two ohmic electrodes, portions of the adjacent gate electrodes, the portions being interposed between the two ohmic electrodes and the whole of the conductive region are formed in a common isolation region for isolating an element from the other region.

3. The switching element according to claim 1, wherein one end of the gate electrode adjacent to the two ohmic electrode among the at least two gate electrodes extends in a direction apart from the conductive region interposed.

4. The switching element according to claim 1, wherein the conductive region includes an n-type cap layer in which impurity ions having an n-type conductivity are introduced.

5. The switching element according to claim 1, wherein the compound semiconductor channel layer comprises a pseudomorphic compound semiconductor channel layer.

6. The switching element according to claim 1, wherein the compound semiconductor buffer layer comprises a metamorphic compound semiconductor buffer layer.

7. The switching element according to claim 1, wherein the respective resistance values of the resistors are smaller than the effective resistance values of the conductive region.

8. An antenna switch circuit, comprising:
a first terminal for inputting a transmitted signal;
a second terminal that is connected to the antenna;
a third terminal for outputting a received signal received by the antenna;
a first switching element which is connected between the first terminal and the second terminal; and
a second switching element which is connected between the second terminal and the third terminal,
wherein the first switching element is rendered conductive and the second switching element is rendered nonconductive at the time of transmission, and the first switching element is rendered nonconductive and the second switching element is rendered conductive at the time of reception,
wherein each of the first and second switching elements comprises:
a field effect transistor which comprises
a Schottky layer commonly forming
two ohmic electrodes disposed alternately to be formed as a source electrode and a drain electrode;
at least two gate electrodes disposed between the two ohmic electrodes and formed so as to grovel between the two ohmic electrodes; and
a conductive region interposed between the adjacent gate electrodes among the at least two gate electrodes and along the adjacent gate electrodes,
a compound semiconductor substrate disposed on a side opposite to a surface in which the two ohmic electrodes, the gate electrodes and the conductive region are formed,
a compound semiconductor channel layer and a compound semiconductor buffer layer, both layers being formed between the Schottky layer and the compound semiconductor substrate, and
resistors each serially connecting one end of the conductive layer to each of the two ohmic electrodes.

9. The switching element according to claim 8, wherein the whole of two ohmic electrodes, portions of the adjacent gate electrodes, the portions being interposed between the two ohmic electrodes and the whole of the conductive region are formed in a common isolation region for isolating an element from the other region.

10. The switching element according to claim 8, wherein one end of the gate electrode adjacent to the two ohmic electrode among the at least two gate electrodes extends in a direction apart from the conductive region interposed.

11. The switching element according to claim 8, wherein the conductive region includes an n-type cap layer in which impurity ions having an n-type conductivity are introduced.

12. The switching element according to claim 8, wherein the compound semiconductor channel layer comprises a pseudomorphic compound semiconductor channel layer.

13. The switching element according to claim 8, wherein the compound semiconductor buffer layer comprises a metamorphic compound semiconductor buffer layer.

14. The switching element according to claim 8, wherein the respective resistance values of the resistors are smaller than the effective resistance values of the conductive region.

15. An antenna switch circuit, comprising:
a first terminal for inputting a transmitted signal;
a second terminal that is connected to the antenna;
a third terminal for outputting a received signal received by the antenna;
a first switching element which is connected between the first terminal and the second terminal; and
a second, switching element which is connected between the second terminal and the third terminal,
wherein the first switching element is rendered conductive and the second switching element is rendered nonconductive at the time of transmission, and the first switching element is rendered nonconductive and the second switching element is rendered conductive at the time of reception,
wherein each of the first and second switching elements comprises:
a field effect transistor which comprises
two ohmic electrodes disposed alternately to be formed as a source electrode and a drain electrode;
at least two gate electrodes disposed between the two ohmic electrodes and formed so as to grovel between the two ohmic electrodes; and
a conductive region interposed between the adjacent gate electrodes among the at least two gate electrodes and along the adjacent gate electrodes, and resistors each serially connecting one end of the conductive layer to each of the two ohmic electrodes.

16. The antenna switch circuit according to claim 15, wherein the whole of two ohmic electrodes, portions of the adjacent gate electrodes, the portions being interposed between the two ohmic electrodes and the whole of the conductive region are formed in a common isolation region for isolating an element from the other region.

17. The antenna switch circuit according to claim 15, wherein one end of the gate electrode adjacent to the two ohmic electrode among the at least two gate electrodes extends in a direction apart from the conductive region interposed.

18. The antenna switch circuit according to claim 15, wherein the conductive region includes an n-type cap layer in which impurity ions having an n-type conductivity are introduced.

19. The switching element according to claim 15, wherein the compound semiconductor channel layer comprises a pseudomorphic compound semiconductor channel layer.

20. The switching element according to claim 15, wherein the compound semiconductor buffer layer comprises a metamorphic compound semiconductor buffer layer.

* * * * *